(12) United States Patent  
Ji et al.

(10) Patent No.: US 11,067,658 B2  
(45) Date of Patent: Jul. 20, 2021

(54) PROBE CARD INSPECTION WAFER, PROBE CARD INSPECTION SYSTEM, AND METHOD OF INSPECTING PROBE CARD

(71) Applicant: Samsung Electronics Co., Ltd., Suwon-si (KR)

(72) Inventors: Joon-su Ji, Hwaseong-si (KR); Dany Kim, Hwaseong-si (KR); Han-jik Nam, Seoul (KR); Jin-woo Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 66 days.

(21) Appl. No.: 16/354,633

(22) Filed: Mar. 15, 2019

(65) Prior Publication Data

US 2020/0088827 A1 Mar. 19, 2020

(30) Foreign Application Priority Data

Sep. 13, 2018 (KR) .......................... 10-2018-0109859

(51) Int. Cl.
*G01R 31/26* (2020.01)
*G01R 35/00* (2006.01)
(Continued)

(52) U.S. Cl.
CPC ........... *G01R 35/00* (2013.01); *G01R 1/0416* (2013.01); *G01R 1/073* (2013.01); *G01R 1/07342* (2013.01); *G01R 31/2831* (2013.01)

(58) Field of Classification Search
CPC . B23K 20/00; C25D 5/00; G01D 5/00; G01D 3/00; G01K 3/00; G01K 1/00; (Continued)

(56) References Cited

U.S. PATENT DOCUMENTS 5,491,427 A 2/1996 Ueno et al.
6,965,244 B2 * 11/2005 Miller ................ G01R 1/07314
324/754.14
(Continued)

FOREIGN PATENT DOCUMENTS

JP 1995-063788 A 3/1995
JP 3049446 B2 6/2000
(Continued)

*Primary Examiner* — Farhana A Hoque
*Assistant Examiner* — Joseph O Nyamogo
(74) *Attorney, Agent, or Firm* — Muir Patent Law, PLLC

(57) ABSTRACT

A probe card inspection wafer includes a base wafer and first and second probe card inspection chips on the base wafer and apart from each other, wherein each of the first and second probe card inspection chips located on the base wafer is divided into a probe vertical-level inspection region, a probe horizontal-position inspection region, and contact inspection regions, wherein the first and second probe card inspection chips include first pad arrays located on the probe vertical-level inspection region and configured for inspecting vertical levels of first and second alternating-current (AC) probes of a probe card to be inspected, and second pad arrays located on the probe vertical-level inspection region and configured for inspecting vertical levels of first and second VSS probes of the probe card to be inspected.

20 Claims, 14 Drawing Sheets

(51) Int. Cl.
*G01R 1/073* (2006.01)
*G01R 1/04* (2006.01)
*G01R 31/28* (2006.01)

(58) Field of Classification Search
CPC . G01K 5/00; G01K 7/00; G01K 11/00; G01K 15/00; G01K 2219/00; G01Q 60/00; G01Q 70/00; G01Q 10/00; G01R 1/00; G01R 3/00; G01R 27/00; G01R 29/00; G01R 31/00; G01R 35/00; G01R 19/00; G01R 21/00; G01R 22/00; G01R 33/00; H01F 17/00; H01F 27/00; H01F 2017/00; H01F 2021/00; H01L 22/00; H01L 23/00; H01L 24/00; H01L 25/00; H01L 27/00; H01L 29/00; H01L 2223/00; H01L 2224/00; H01L 2924/00; H01R 9/00; H01R 12/00; H02M 1/00; H02M 3/00; H02M 7/00; H02M 2001/00; H02M 2003/00; H02P 5/00; H03B 5/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03L 7/00; H03L 2207/00; H04L 27/00; H04R 3/00; H04R 29/00; H05K 1/00; H05K 3/00; H05K 7/00; H05K 2201/00; Y02B 70/00; Y02P 70/00; Y10T 29/00; Y10T 307/00; G01B 5/00; G01B 7/00; G01B 17/00; G01B 21/00; G01H 9/00; G01H 11/00; G01J 1/00; G01J 3/00; G01J 5/00; G01L 1/00; G01L 5/00; G01L 9/00; G01L 21/00; G01M 3/00; G01M 5/00; G01M 13/00; G01M 15/00; G01N 2291/00; G01N 3/00; G01N 5/00; G01N 9/00; G01N 17/00; G01N 21/00; G01N 22/00; G01N 23/00; G01N 24/00; G01N 25/00; G01N 27/00; G01N 29/00; G01N 31/00; G01N 33/00; G01N 2021/00; G01P 3/00; G01S 5/00; G01S 13/00; G01V 3/00; G02B 1/00; G02B 6/00; G02B 2006/00; G02F 1/00; G02F 2/00; G02F 2001/00; G02F 2201/00; G02F 2202/00; G02F 2203/00; G03G 15/00; G03H 1/00; G03H 2001/00; G03H 2226/00; G04F 5/00; G05D 23/00; G05F 3/00; G06F 1/00; G06F 3/00; G06F 17/00; G06K 7/00; G06K 9/00; G06N 3/00; G06N 10/00; G06N 20/00; G06Q 10/00; G06T 5/00; G06T 7/00; G06T 11/00; G06T 2207/00; G06T 2211/00; G07C 9/00; G08B 17/00; G08B 21/00; G08B 29/00; G09G 3/00; G09G 2300/00; G09G 2320/00; G09G 2330/00; G09G 2360/00; G09G 2370/00; G11B 9/00; G11C 11/00; G11C 13/00; G11C 29/00; G21K 1/00; G16H 30/00; G16H 50/00
USPC .................................................... 324/750.16
See application file for complete search history.

(56) References Cited

U.S. PATENT DOCUMENTS

| | | | |
|---|---|---|---|
| 7,474,109 B2 | 1/2009 | Kuitani et al. | |
| 7,948,252 B2* | 5/2011 | Grube | G01R 1/07357 324/754.07 |
| 9,696,402 B2* | 7/2017 | Kang | G01R 35/00 |
| 2004/0041581 A1 | 3/2004 | Saijyo et al. | |
| 2005/0227383 A1* | 10/2005 | Okamoto | G01R 1/07307 438/14 |
| 2010/0213960 A1* | 8/2010 | Mok | G01R 31/2889 324/762.03 |
| 2015/0268275 A1 | 9/2015 | Kuitani | |
| 2018/0156842 A1* | 6/2018 | Kim | G01R 1/07342 |

FOREIGN PATENT DOCUMENTS

| | | |
|---|---|---|
| JP | 35744-44 B2 | 10/2004 |
| JP | 3620912 B2 | 2/2005 |
| JP | 2006-250546 A | 9/2006 |
| JP | 2011-085483 A | 4/2011 |
| JP | 4679244 B2 | 4/2011 |
| JP | 5260163 B2 | 8/2013 |
| JP | 2014-235126 A | 12/2014 |
| JP | 5865021 B2 | 2/2016 |
| JP | 6006345 B2 | 10/2016 |
| JP | 2016-212065 A | 12/2016 |
| KR | 10-2015-0070857 A | 6/2015 |

* cited by examiner

PROBE CARD INSPECTION WAFER, PROBE CARD INSPECTION SYSTEM, AND METHOD OF INSPECTING PROBE CARD

CROSS-REFERENCE TO RELATED APPLICATIONS

This application claims the benefit of priority to Korean Patent Application No. 10-2018-0109859, filed on Sep. 13, 2018, in the Korean Intellectual Property Office, the disclosure of which is incorporated herein in its entirety by reference.

BACKGROUND

The present disclosure relates to a probe card inspection wafer, a probe card inspection system, and a method of inspecting a probe card. More specifically, the present disclosure relates to a probe card inspection wafer, a probe card inspection system, and a method of inspecting a probe card, by which inspection speed and reliability may be enhanced.

After a plurality of semiconductor devices are formed on a wafer using a process of manufacturing a semiconductor device, an electrical characteristics test may be performed on each of the semiconductor devices. The electrical characteristics test may be performed by applying an electric signal to the semiconductor devices formed on the wafer and reading an output signal corresponding to the applied electric signal. In this case, the application and reading of the electric signal may be performed by a probe card including a plurality of probes that may be in contact with terminals formed in the semiconductor devices.

SUMMARY

The present disclosure describes a probe card inspection wafer, a probe card inspection system, and a method of inspecting a probe card, by which reliability and inspection speed may be enhanced.

Aspects of the inventive concept should not be limited by the above description, and other unmentioned aspects will be clearly understood by one of ordinary skill in the art from example embodiments described herein.

According to an aspect of the inventive concept, a probe card inspection system includes a base wafer and first and second probe card inspection chips on the base wafer and spaced apart from each other. Each of the first and second probe card inspection chips located on the base wafer is divided into a probe vertical-level inspection region, a probe horizontal-position inspection region, and contact inspection regions. The first and second probe card inspection chips include first pad arrays located on the probe vertical-level inspection region and configured for inspecting vertical levels of first and second alternating-current (AC) probes of a probe card to be inspected, and second pad arrays located on the probe vertical-level inspection region and configured for inspecting vertical levels of first and second VSS probes of the probe card to be inspected.

According to an aspect of the inventive concept, a probe card inspection wafer includes a base wafer, a plurality of read pads located on the base wafer, a plurality of pads to be inspected, which are located on the base wafer and apart from the plurality of read pads in a lateral direction, and coupling wire patterns that each connect one of the plurality of read pads with one of the pads to be inspected. Each of the coupling wire patterns is connected to only one of the plurality of pads to be inspected.

According to an aspect of the inventive concept, a probe card inspection wafer includes a base wafer and first to third pad arrays on the base wafer. The first pad array includes first data pads and a plurality of AC probe inspection pads spaced apart from each other and aligned with each other in a first direction parallel to a top surface of the base wafer, and first coupling wire patterns that each connect one of the AC probe inspection pads with one of the first data pads. The second pad array includes second data pads and a plurality of VCC probe inspection pads spaced apart from each other and aligned with each other in the first direction, and second coupling wire patterns that each connect one of the VCC probe inspection pads with one of the second data pads. The third pad array includes third data pads and a plurality of VSS probe inspection pads spaced apart from each other and aligned with each other in the first direction, and third coupling wire patterns that each connect one of the AC probe inspection pads with one of the first data pads.

According to an aspect of the inventive concept, a probe card inspection system includes a tester head configured to apply an electric signal or an electric potential to a probe card, the tester head including a plurality of VSS lines, a plurality of AC lines, a plurality of input/output (I/O) lines, and a plurality of direct-current (DC) lines, a probe card inspection wafer, and a chuck configured to support the probe card inspection wafer. The probe card inspection wafer includes a base wafer and first and second probe card inspection chips on the base wafer, the first and second probe card inspection chips spaced apart from each other. Each of the first and second probe card inspection chips located on the base wafer is divided into a probe vertical-level inspection region, a probe horizontal-position inspection region, and contact inspection regions. The first and second probe card inspection chips include first and second pad arrays located on the probe vertical-level inspection region. The first pad array includes first read pads and a plurality of AC probe inspection pads spaced apart from each other and aligned with each other in a first direction parallel to a top surface of the base wafer, and first coupling wire patterns that each connect one of the plurality of first read pads with one of the plurality of AC probe inspection pads. The second pad array includes second read pads and a plurality of VSS inspection pads spaced apart from each other and aligned with each other in the first direction, and second coupling wire patterns that each connect one of the plurality of second read pads with one of the plurality of AC probe inspection pads.

According to an aspect of the inventive concept, a method of inspecting a probe card includes inspecting I/O probes and DC probes included in a probe card, and inspecting VSS probes and AC probes included in the probe card using results of the inspecting of the I/O probes and the DC probes. The inspection of the VSS probes and the AC probes includes connecting one of the VSS probes with one of the I/O probes and one of the DC probes, and connecting one of the AC probes with one of the I/O probes and one of the DC probes.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
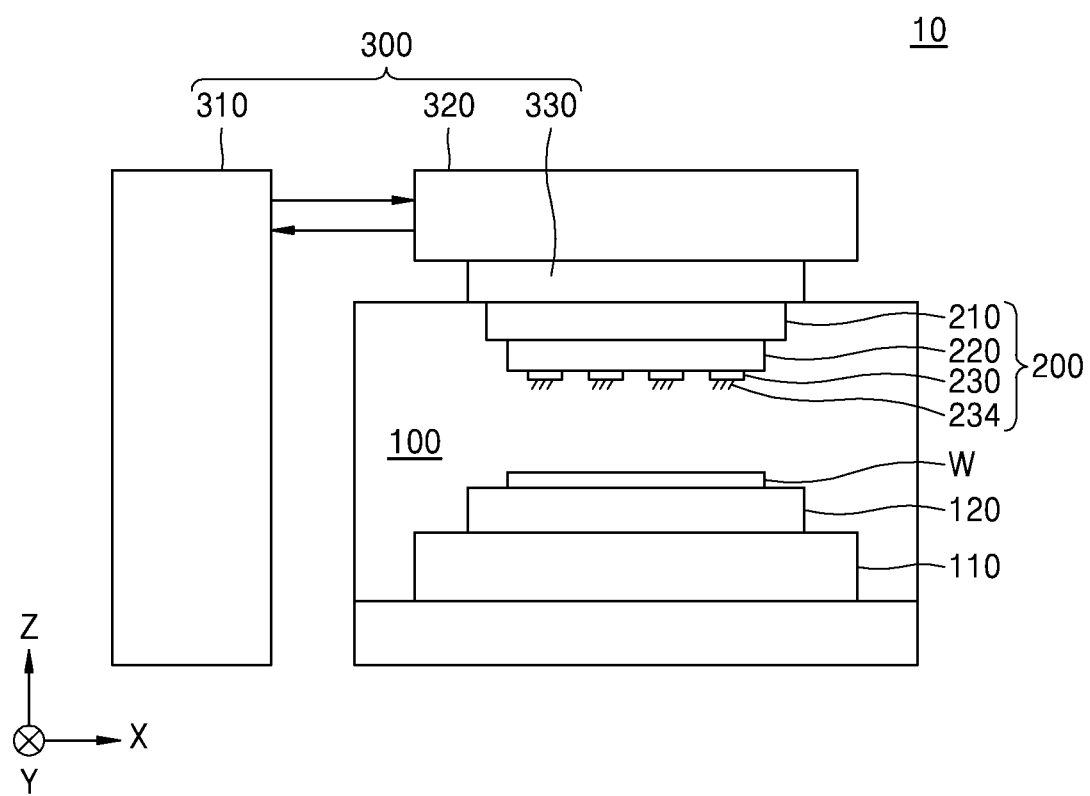
FIG. 1 is a schematic diagram of an inspection system according to an embodiment.

FIG. 1 is a schematic diagram of an inspection system 10 according to some embodiments.

Referring to FIG. 1, the inspection system 10 may include an inspection chamber 100, a probe card 200, and a test device 300.

A chuck driving device 110, a chuck 120, and a base wafer W may be disposed in the inspection chamber 100. The base wafer W may be mounted on the chuck 120. Here, the base wafer W may be a semiconductor wafer on which a plurality of semiconductor devices are formed or a probe card inspection wafer on which a conductive pattern configured to inspect a probe card is formed as described below. According to some embodiments, the base wafer W may be mounted on the chuck 120 so that terminals (e.g., refer to contact pads in FIG. 2) of a semiconductor device or the conductive pattern configured to inspect the probe card 200 face the probe card 200.

The inspection system 10 may test electrical characteristics of a device under test (DUT) including a plurality of semiconductor devices in the inspection chamber 100. According to some embodiments, an electric die sorting (EDS) process may be performed in the inspection chamber 100. According to some embodiments, a probe card may be inspected in the inspection chamber 100.

Here, the EDS process may refer to a process of applying an electric signal to the semiconductor devices formed on the base wafer W and determining whether the semiconductor devices are defective based on signals output by the semiconductor devices in response to the applied electric signal.

According to some embodiments, to test the electrical characteristics of the DUT, the inspection system 10 may perform a direct-current (DC) test or an alternating-current (AC) test on the base wafer W. Here, the DC test may include applying a predetermined voltage to an input pad of the base wafer W, measuring DC characteristics, such as an open/short, an input current, an output voltage, and a power current, and determining whether the DUT is defective. Also, the AC test may include applying a pulse signal to the input pad of the base wafer W, measuring operating characteristics, such as an input/output delivery delay time and a start/end time of an output signal, and determining whether the DUT is defective.

According to some embodiments, to inspect whether the probe card 200 is defective, the inspection system 10 may apply a configured voltage to the conductive pattern of the base wafer W using any one of probes 234 of the probe card and detect a transmitted output signal using another one of the probes 234.

The chuck 120 may be disposed on the chuck driving device 110. The chuck 120 may fix the base wafer W using an electrostatic adsorption method or a vacuum adsorption method. Sand paper having a predetermined roughness may be further located on one side surface of the chuck 120. When the probes 234 are contaminated with foreign materials, the contaminated probes 234 may be sanded by the sand paper to remove the foreign materials.

The chuck driving device 110 may be arranged under the chuck 120 and connected to the chuck 120. The chuck driving device 110 may translate the chuck 120 in first to third directions X, Y, and Z. Alternatively, the chuck driving device 110 may rotate the chuck 120. Here, the first and second directions X and Y may refer to two directions parallel to a top surface of the base wafer W and substantially perpendicular to each other, and the third direction Z may refer to a direction substantially perpendicular to the top surface of the base wafer W. Unless described otherwise below, the definitions of directions may be applied likewise to all drawings below. For example, even when only a portion of the inspection system 10 is illustrated, the definitions of the first to third directions X, Y, and Z based on the top surface of the base wafer W may be the same. Thus, the base wafer W fixed to the chuck 120 may linearly move or rotate in the first and second directions X and Y, which are horizontal directions, or the third direction Z, which is a vertical direction.

According to some embodiments, the chuck driving device 110 may rotate the chuck 120 so that a direction in which electrode terminals of the semiconductor device formed on the base wafer W or conductive patterns configured to test the probe card 200 are arranged may be aligned with a direction in which the probes 234 are arranged. According to some embodiments, the chuck driving device 110 may move the chuck 120 in first and second directions X and Y so that the electrode terminals of the semiconductor device formed on the base wafer W or the conductive patterns configured to test the probe card 200 are aligned in a perpendicular direction to the probes 234. According to some embodiments, the chuck driving device 110 may move the chuck 120 in the third direction Z so that the electrode terminals of the semiconductor device formed on the base wafer W or the conductive patterns configured to test the probe card 200 may be electrically or physically connected to the probes 234.

When the base wafer W is a probe card inspection wafer, the probes 234 and conductive patterns formed on the probe card inspection wafer may relatively move due to the driving of the chuck 120 so that the probes 234 may be aligned with and contacted by the conductive patterns formed on the probe card inspection wafer. In this case, the probes 234 may be sequentially aligned with and contacted by a contact inspection pattern (refer to CIP in FIG. 5), first and second horizontal-position inspection patterns (refer to HPIP1 and HPIP2 in FIG. 5), and first to third pad arrays (refer to PDAR1, PDAR2, and PDAR3 in FIG. 5) so that different characteristics of different probes 234 may be inspected.

According to some embodiments, the probe card 200 may include a printed circuit board (PCB) 210, a tile fixing substrate 220, and a plurality of ceramic tiles 230. According to some embodiments, each of the ceramic tiles 230 may include a plurality of probes 234, which may protrude in the third direction Z. According to some embodiments, each of the ceramic tiles 230 may correspond to one chip (refer to CHP in FIG. 4). However, the inventive concept is not limited thereto, and the plurality of ceramic tiles 230 may correspond to one chip (refer to CHP in FIG. 4), or one ceramic tile 230 may correspond to a plurality of chips (refer to CHP in FIG. 4).

According to some embodiments, the test device 300 may include a tester main body 310, a tester head 320, and a base 330. The base 330 may be connected to the probe card 200. According to some embodiments, the base 330 may be connected to the PCB 210 of the probe card 200.

According to some embodiments, the tester head 320 may be electrically connected to the probe card 200 through the base 330. Also, the tester head 320 may be electrically connected to the tester main body 310 and transmit an electric signal generated by the tester main body 310 to the probe card 200.

The tester main body 310 may output an electric signal for inspecting a semiconductor device and read an electric signal corresponding to an inspection result. According to some embodiments, the tester main body 310 may determine whether an operation of the semiconductor device formed on the base wafer W is normal, for example by comparing the inspection result to a predetermined expected result. According to some embodiments, the tester main body 310 may determine whether an operation of the probe card 200 is normal.

According to some embodiments, the tester main body 310 may output an electric signal used for an electrical characteristic inspection of the semiconductor device formed on the base wafer W. According to some embodiments, the electric signal output by the tester main body 310 may be applied to the semiconductor device formed on the base wafer W through the tester head 320 and the probe card 200. The semiconductor device may perform an operation in response to the applied electric signal and output an electric signal corresponding to the inspection result through an electrode terminal. The electric signal corresponding to the inspection result, which is output from the electrode terminal, may be transmitted to the test main body 310 through the probe card 200 and the tester head 320. Thus, the test device 300 may determine whether an operation of the semiconductor device formed on the base wafer W is normal.

According to some embodiments, the tester main body 310 may output an electric signal used for an electrical characteristic inspection of the probe card 200. According to some embodiments, the electric signal output by the tester main body 310 may be applied through the tester head 320 and the probe card 200 to the conductive pattern configured to inspect the probe card 200 disposed on the base wafer W. The electric signal applied to the conductive pattern configured to inspect the probe card 200 may be transmitted again to the probe card 200 via a predetermined electrical path. The electric signal transmitted to the probe card 200 may be transmitted through the tester head 320 to the tester main body 310. The tester main body 310 may determine whether the probe card 200 is normal or defective, using the transmitted electric signal (or the non-transmittance of the electric signal).

Figure 2:
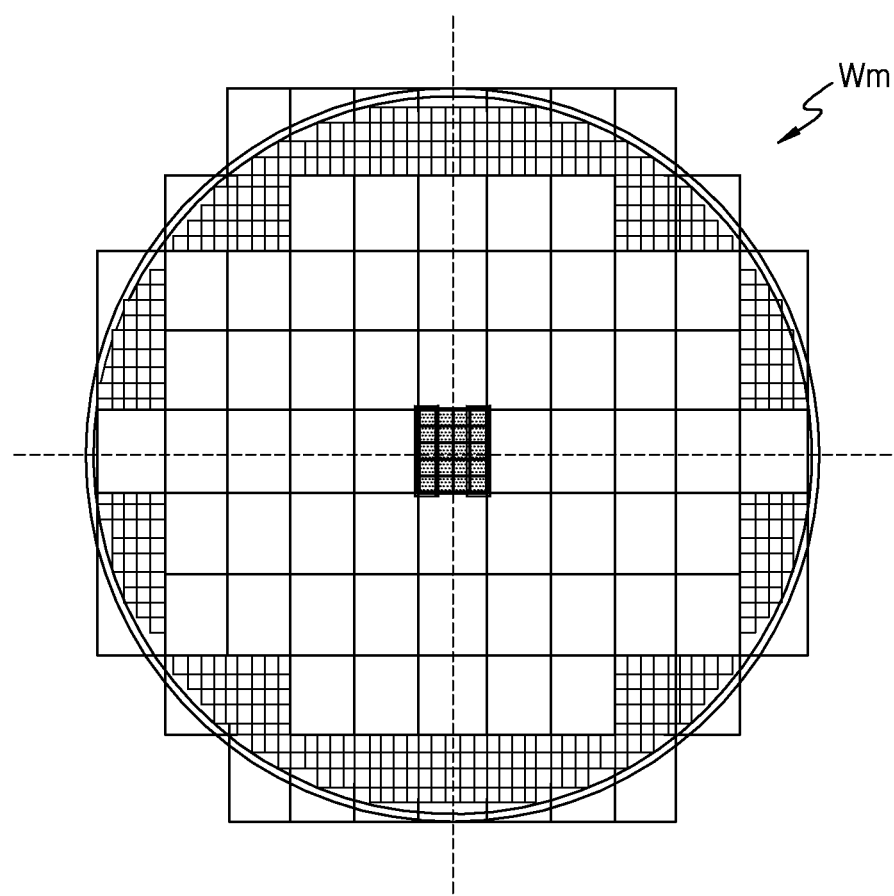
FIGS. 2 and 3 are plan views of configurations of a wafer shown in FIG. 1 according to an embodiment.
Figure 3:
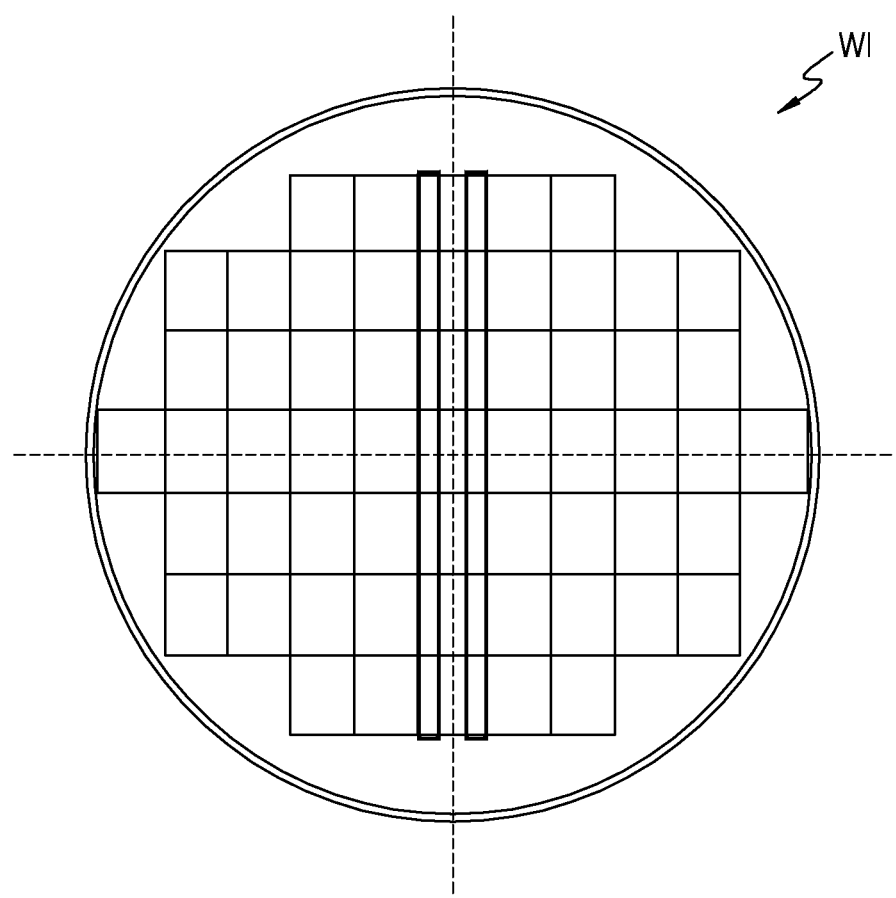

FIGS. 2 and 3 are plan views of configurations of the base wafer W shown in FIG. 1.

More specifically, a wafer Wm shown in FIG. 2 may be a wafer on which a semiconductor device (e.g., a memory chip) is formed or a probe card inspection wafer configured to inspect a probe card (refer to 200 in FIG. 1) configured to inspect a wafer on which a memory chip is formed. Also, a wafer Wl shown in FIG. 3 may be a wafer on which a semiconductor device (e.g., a logic chip) is formed or a probe card inspection wafer configured to inspect a probe card (refer to 200 in FIG. 1) configured to inspect a wafer on which a logic chip is formed.

Referring to FIG. 2, one full shot of the wafer Wm may include a plurality of memory chips or a plurality of probe card inspection chips. For example, 25 memory chips or 25 probe card inspection chips may be included in one full shot. According to some embodiments, when memory chips are manufactured using the wafer Wm, 87 shots of stepper-type exposure or scanner-type exposure may be performed to pattern the entire wafer Wm. In FIG. 2, each of the full shots is illustrated with a big square, and each of the memory chips is illustrated with a small square.

In this case, since an outer portion of the wafer Wm does not constitute a full shot, when an exposure process is performed on the outer portion of the wafer Wm, only a portion of a mask pattern may be transferred to the wafer Wm. Although the outer portion of the wafer Wm is not transferred as a full shot, a pattern required for a memory chip or a probe card inspection chip may be transferred by partially transferring a configured pattern. Accordingly, even memory chips or probe card inspection chips of the outer portion of the wafer Wm may effectively operate.

Referring to FIG. 3, in the case of the wafer Wl of the logic chip, one logic chip or probe card inspection chip may correspond to one full shot. According to some embodiments, the wafer Wl of the logic chip may include 57 full shots. However, an outer portion of the wafer Wl of the logic chip may not constitute an effectively operable logic chip unlike a memory chip.

Figure 4:
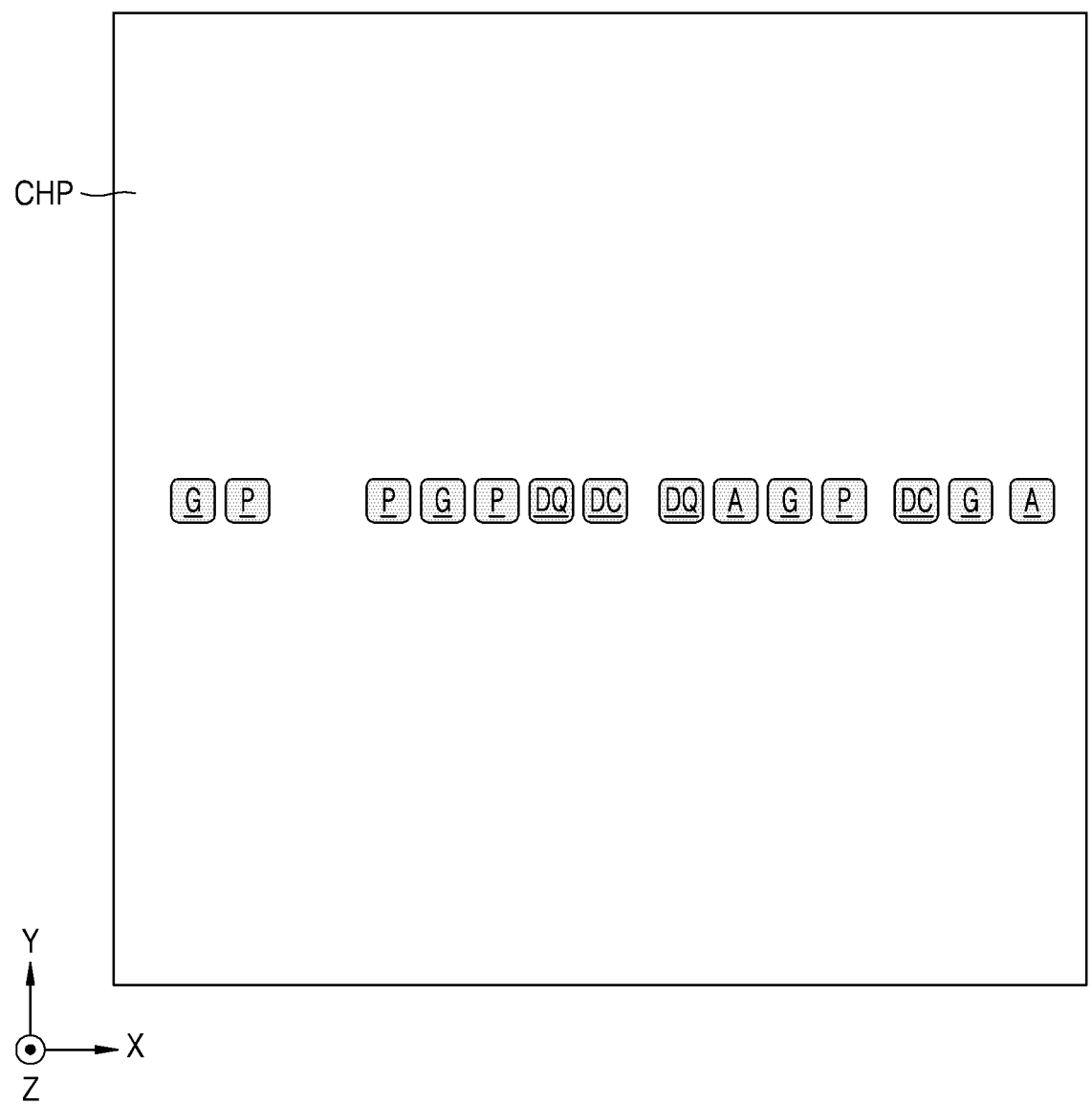
FIG. 4 is a plan view of a chip that is inspected by a probe card that is inspected by a probe card inspection chip according to an embodiment.

FIG. 4 is a plan view of a chip CHP that is inspected by a probe card according to some embodiments.

According to some embodiments, the chip CHP may be a wafer-level chip CHP. Here, a wafer-level chip may refer to a chip CHP that has not yet been separated into individual chips formed on a wafer. A scribe lane may be located between adjacent chips CHP. The scribe lane may be a separation line for separating the tested chip CHP into individual chips.

According to some embodiments, the chip CHP may be a memory device. According to some embodiments, the chip CHP may be a non-volatile memory device. According to some embodiments, the chip CHP may be a non-volatile NAND-type flash memory. According to some embodiments, the chip CHP may include phase-change random access memory (PRAM), magnetic RAM (MRAM), resistive RAM (ReRAM), ferroelectric RAM (FRAM), and/or NOR flash memory. Also, the chip CHP may be a volatile memory device (e.g., dynamic RAM (DRAM) and static random access memory (SRAM)) configured to lose data when power is interrupted.

According to some embodiments, for example, the chip CHP may be a logic chip, a measuring element, a communication device, a digital signal processor (DSP), or a system-on-chip (SOC).

Although FIG. 4 illustrates an example in which the chip CHP has an approximately regular tetragonal profile, the inventive concept is not limited thereto. For example, the chip CHP may be a driver integrated circuit (IC) chip. In this case, two facing sides of the chip CHP may be longer than other two facing sides of the chip CHP, which are perpendicular to the two facing sides.

A plurality of pads configured to test the semiconductor device may be formed on the chip CHP. The pads may include, for example, a ground pad G, a power pad P, an AC pad A, a data pad DQ, and a DC pad DC.

The ground pad G may be a pad configured to provide a reference electric potential for a circuit operation. The power pad P may be a pad configured to supply power for a circuit operation. The AC pad A may be a pad configured to supply AC power to the chip CHP or to receive a signal for performing the above-described AC test. The DC pad DC may be pad configured to measure a potential level of a specific position of the chip CHP. More specifically, the DC pad DC may be a pad configured to inspect whether a configured voltage is applied to a configured position of the chip CHP when a driving voltage is applied to the chip CHP. The data pad DQ may be a pad configured to input and output a logic signal or data.

Although FIG. 4 illustrates an example in which the chip CHP includes a plurality of pads arranged and aligned in a first direction X, the inventive concept is not limited thereto. For example, the plurality of pads may be arranged in a plurality of rows. Alternatively, the plurality of pads may be arranged in a matrix of rows and columns or in a cross shape. Alternatively, the plurality of pads may be arranged in scribe lanes, which are spaces between chips.

Referring to FIGS. 1 and 4, pads having different configurations may be provided according to the type of the chip CHP, and the probe card 200 configured to inspect the pads may have probes 234 corresponding to the pads formed in the chip CHP. The probe card 200 may have the probes 234 corresponding respectively to a plurality of chips CHP to simultaneously inspect the plurality of chips CHP. More specifically, the tester head 320 may transmit an electric signal for a test to the probe card 200 through a plurality of signal lines. To increase inspection speed, each of the plurality of signal lines may be branched again into a plurality of probes 234 in the probe card 200.

Figure 5:
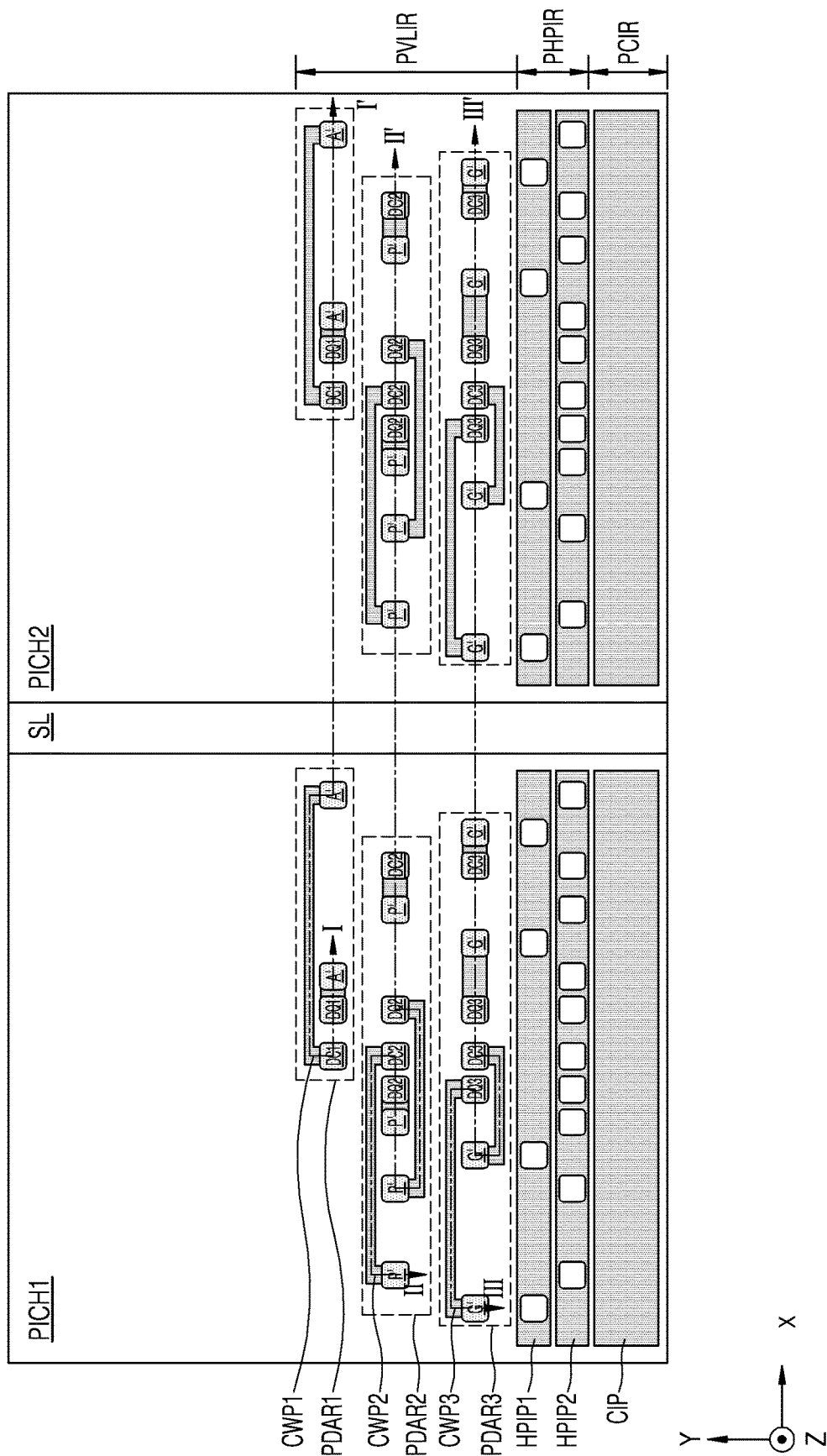
FIG. 5 is a plan view of a portion of a probe card inspection wafer according to an embodiment.

FIG. 5 is a plan view of a portion of a probe card inspection wafer according to some embodiments. More specifically, FIG. 5 is a plan view showing first and second probe card inspection chips PICH1 and PICH2 included in a probe card inspection wafer and a scribe lane SL arranged between the first and second probe card inspection chips PICH1 and PICH2.

Figure 6:
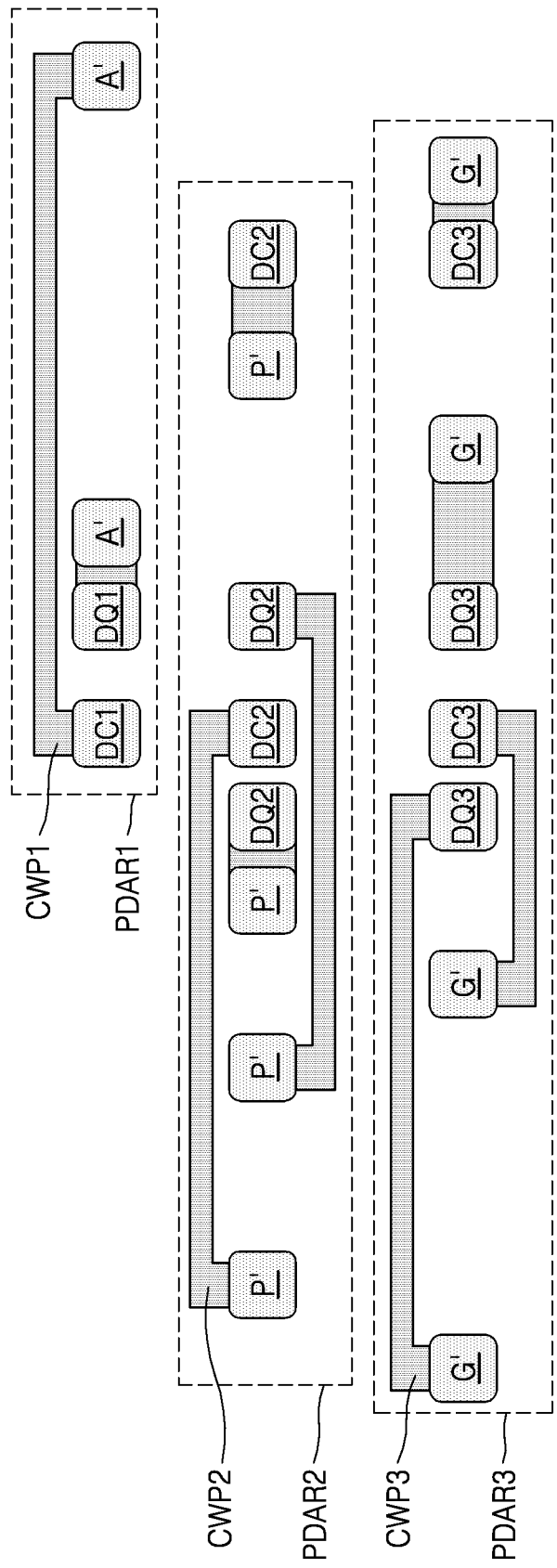
FIG. 6 is a partial enlarged plan view of a portion of FIG. 5.

FIG. 6 is a partial enlarged plan view of first to third pad arrays of FIG. 5.

Referring to FIGS. 5 and 6, the first and second probe card inspection chips PICH1 and PICH2 may have pads corresponding to the probes 234 of the probe card 200 shown in FIG. 1. In this case, since the probes 234 shown in FIG. 1 correspond to the pads included in the chip (refer to CHP in FIG. 4), the pads included in the first and second probe card inspection chips PICH1 and PICH2 may correspond to the pads included in the chip (refer to CHP in FIG. 4). In the various embodiments, pads described in accordance with their functionality, such as AC pads, DC pads, data pads DQ, power pads P, and ground pads G are configured in a particular orientation on the probe card inspection chip so that they correspond to and accurately align with probes 234 of a probe card 200 configured to connect with respective signal or electrical potential lines in the tester head 320. For example, a particular AC pad and DQ pad of the probe card inspection chip may be oriented with respect to each other so that a probe card having an AC probe connected to receive an AC signal and an I/O probe connected to receive an I/O signal have the same orientation with respect to each other as the orientation of the AC pad and DQ pad. Certain of the pads of the probe card inspection chip are electrically connected with other pads of the probe card inspection chip using wire patterns, or wires, to allow for proper testing of the probes 234 of the probe card 200, as discussed further below. Components described as electrically connected are connected to allow signals or voltage to pass from one component to the other component.

According to some embodiments, the first and second probe card inspection chips PICH1 and PICH2 may be arranged apart from each other in a lateral direction with the scribe lane SL therebetween. According to some embodiments, the first and second probe card inspection chips PICH1 and PICH2 may be substantially identical to each other. According to some embodiments, merged probes that will be described below may be shared between the first and second probe card inspection chips PICH1 and PICH2. According to some embodiments, the first and second probe card inspection chips PICH1 and PICH2 may be chips corresponding to the chips of FIG. 4. In some descriptions herein, the term "semiconductor chip," "memory chip," or "logic chip," may be used to describe a chip that is included in an electronic product, such as a semiconductor package (e.g., memory package, logic package, or combined memory and logic package). In contrast, a "probe card inspection chip" refers to a chip that is only used for inspection purposes and is not included in an electronic product after its inspection is complete.

According to some embodiments, each of the first and second probe card inspection chips PICH1 and PICH2 may include a probe vertical-level inspection region PVLIR, a probe horizontal-position inspection region PHPIR, and a probe contact inspection region PCIR. Each of the probe vertical-level inspection region PVLIR, the probe horizontal-position inspection region PHPIR, and the probe contact inspection region PCIR may be a region that has a predetermined width in a second direction Y and extends in a first direction X.

According to some embodiments, wire patterns and pads configured to inspect a vertical level (i.e., a contact or non-contact) of at least a portion of the probes (refer to 234 in FIG. 1) may be formed on the probe vertical-level inspection region PVLIR. According to some embodiments, wire patterns and pads configured to inspect a vertical level (i.e., a contact or non-contact) of another portion of the probes (refer to 234 in FIG. 1) may be formed on the probe contact inspection region PCIR. According to some embodiments, wire patterns and pads configured to inspect a horizontal position of at least a portion of the probes (refer to 234 in FIG. 1) (i.e., wire patterns and pads inspect whether the probe (refer to 234 in FIG. 1) has been horizontally aligned with (or vertically overlaps) a component (e.g., a pad) to be contacted) may be formed on the probe horizontal-position inspection region PHPIR.

According to some embodiments, first to third pad arrays PDAR1, PDAR2, and PDAR3 may be arranged on the probe vertical-level inspection region PVLIR. According to some embodiments, first and second horizontal-position inspection patterns HPIP1 and HPIP2 may be arranged on the probe horizontal-position inspection region PHPIR. According to some embodiments, a contact inspection pattern CIP may be arranged on the probe contact inspection region PCIR.

Figure 12:
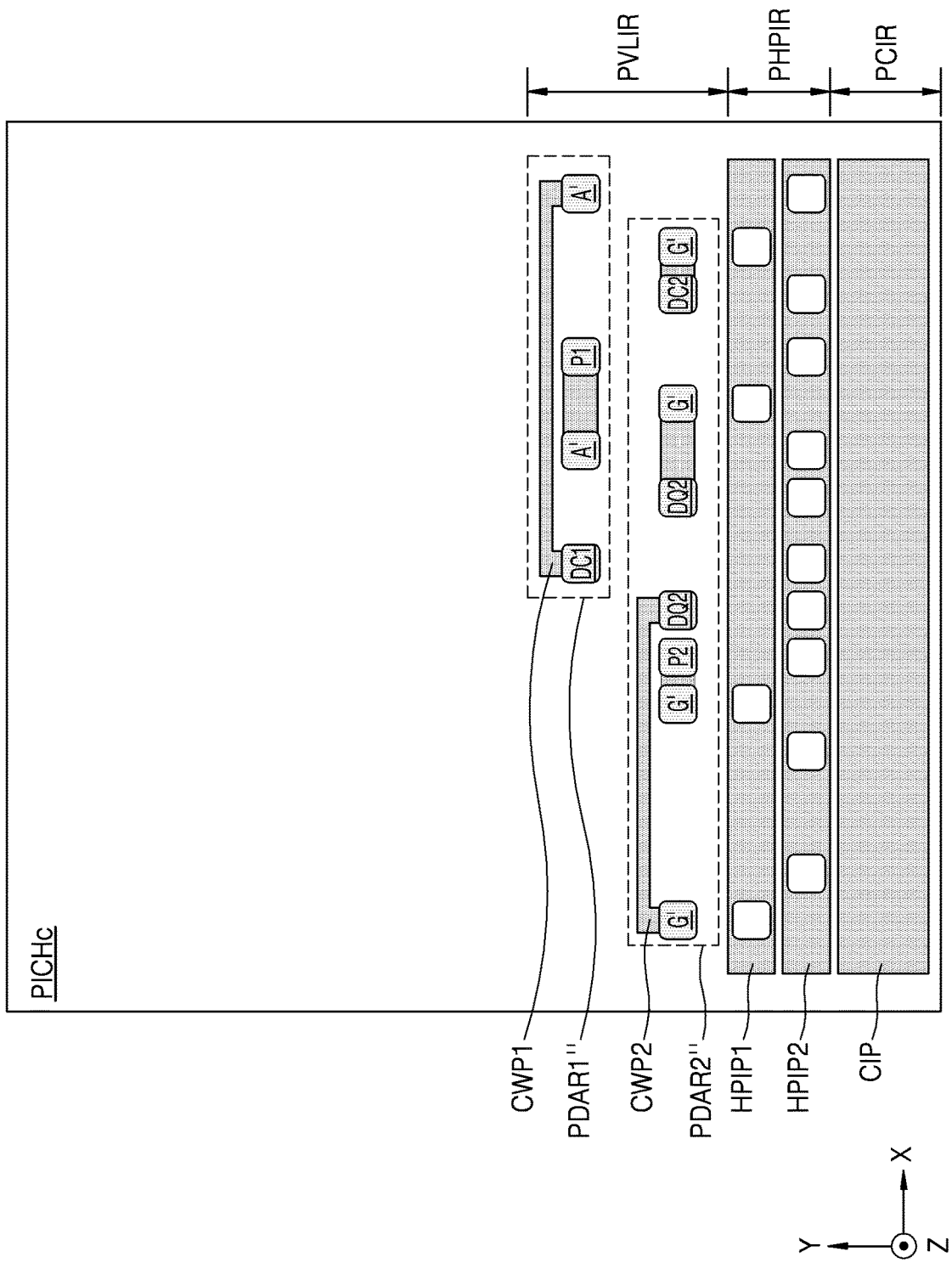

As described above, the definitions of the directions of FIG. 5 may be the same as the definitions of the directions of FIGS. 1 and 12. Two directions substantially parallel to a top surface of a base wafer W may be defined as the first and second directions X and Y. In some embodiments, the first direction X of FIGS. 1 and 2 in which the pads are arranged may also substantially coincide with the first direction X of FIG. 5. Accordingly, when the probes (refer to 234 in FIG. 1) configured to inspect the chip CHP of FIG. 2 are inspected using the first and second probe card inspection chips PICH1 and PICH2 of FIG. 5, the probes (refer to 234 in FIG. 1) may be aligned with one of the first to third pad arrays PDAR1, PDAR2, and PDAR3, the first and second horizontal-position inspection patterns HPIP1 and HPIP2, and contact inspection patterns CIP.

According to some embodiments, the contact inspection pattern CIP may be a pattern configured to inspect a contact of a probe connected to the switch element SW, from among unmerged probes and/or merged probes. A detailed explanation of the merging of probes or merged probes will be described below with reference to FIGS. 7 to 9. As described herein, the inspection of the contact of the probe refers to inspecting whether the probe is located at a configured horizontal and vertical position so as to be in contact with the pad formed on the semiconductor chip to be inspected.

The contact inspection pattern CIP may be elongated in the first direction X. According to some embodiments, the contact inspection pattern CIP may have a substantially rectangular profile. According to some embodiments, the inside of the contact inspection pattern CIP may not be etched. For example, the inside of the profile of the contact inspection pattern CIP may be filled with a conductive material.

According to some embodiments, a length of the contact inspection pattern CIP in the first direction X may be greater than a length of the contact inspection pattern CIP in the second direction Y. According to some embodiments, the length of the contact inspection pattern CIP in the second direction Y may be greater than a length of conductive patterns formed in the probe vertical-level inspection region PVLIR in the second direction Y and a length of conductive patterns formed in the probe horizontal-position inspection region PHPIR in the second direction Y.

According to some embodiments, the contact inspection pattern CIP may include a conductive material. According to some embodiments, the contact inspection pattern CIP may include at least one selected from the group consisting of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and graphene or an alloy thereof. Also, first to third coupling wire patterns CWP1, CWP2, and CWP3, first to third DC pads DC1, DC2, and DC3, first to third data pads DQ1, DQ2, and DQ3, VCC probe inspection pads P', VSS probe inspection pads G', AC probe inspection pads A', and first and second horizontal-position inspection patterns HPIP1 and HPIP2, which will be described below, may include the same material as the contact inspection pattern CIP, but the inventive concept is not limited thereto.

According to some embodiments, the first and second horizontal-position inspection patterns HPIP1 and HPIP2 may be patterns configured to inspect horizontal positions of the probes 234. The first horizontal-position inspection pattern HPIP1 may be a pattern configured to inspect horizontal positions of the probes 234 in contact with the VSS probe inspection pads G'. The second horizontal-position inspection pattern HPIP2 may be a pattern configured to inspect horizontal positions of the probes 234 in contact with the first to third DC pads DC1, DC2, and DC3, the first to third data pads DQ1, DQ2, and DQ3, the VCC probe inspection pads P', and the AC probe inspection pads A'.

According to some embodiments, the first and second horizontal-position inspection patterns HPIP1 and HPIP2 may be elongated in a first direction X. The first and second horizontal-position inspection patterns HPIP1 and HPIP2 may have substantially rectangular profiles and may be patterns configured to inspect the horizontal positions of the probes 234.

According to some embodiments, the first horizontal-position inspection pattern HPIP1 may include a shape obtained by etching a conductive material in a position corresponding to the ground pad G included in the chip CHP of FIG. 2.

According to some embodiments, the second horizontal-position inspection pattern HPIP2 may include a shape obtained by etching a conductive material in positions corresponding to the AC pad A, the power pad P, the data pad DQ, and the DC pad DC included in the chip CHP of FIG. 2.

According to some embodiments, the first to third pad arrays PDAR1, PDAR2, and PDAR3 may include pads and wires configured to inspect a vertical level (i.e., a contact) of a merged probe (refer to 234 in FIG. 1) that will be described below.

Figure 7:
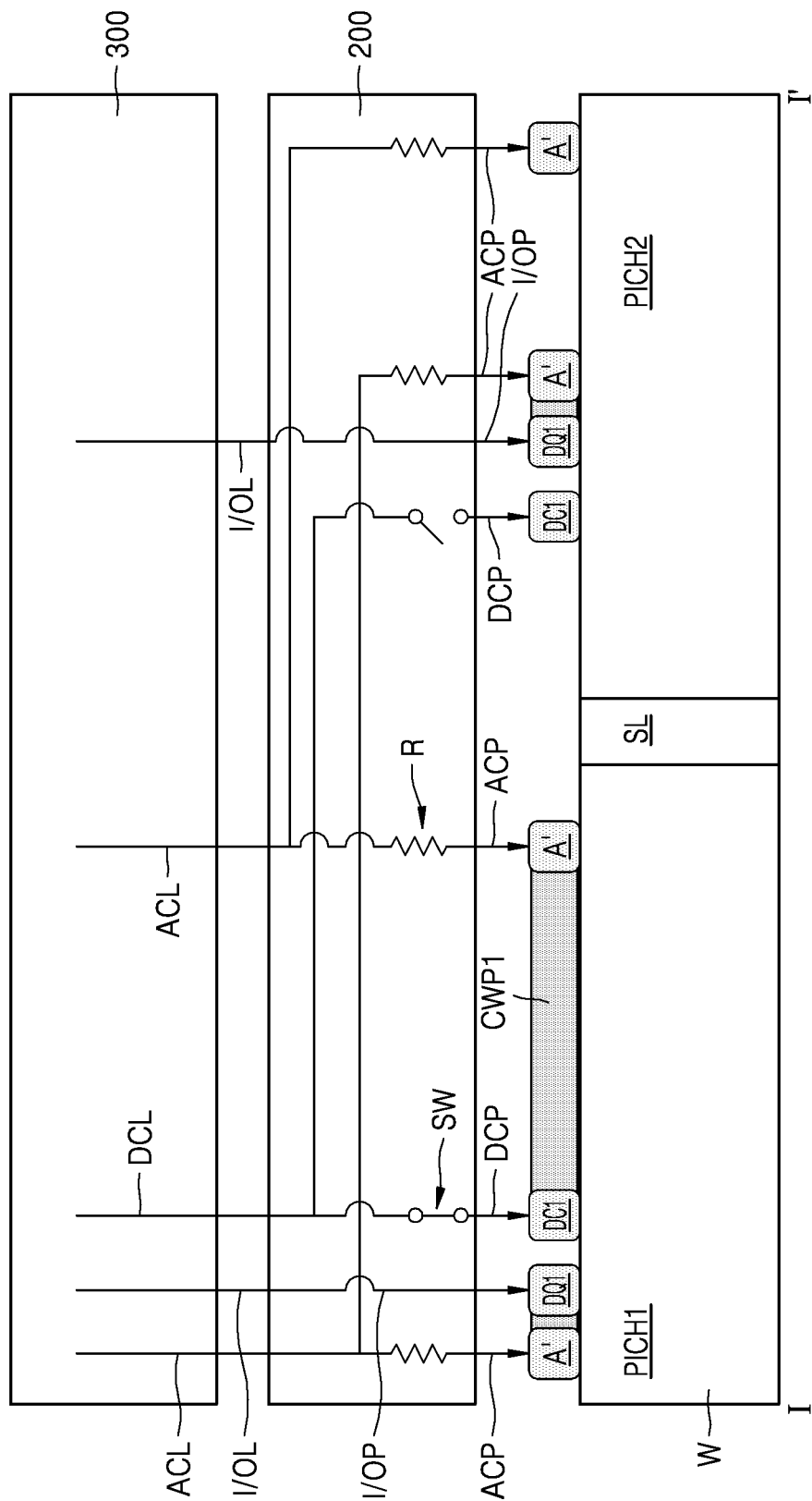
FIGS. 7 to 9 are cross-sectional views taken along lines I-I', II-II', and III-III' of FIG. 5, respectively.

According to some embodiments, the first pad array PDAR1 may include pads and wires configured to inspect a contact of an AC probe (refer to ACP in FIG. 7). According to some embodiments, the first pad array PDAR1 may include AC probe inspection pads A', a first DC pad DC1, a first data pad DQ1, and a first coupling wire pattern CWP1. The first coupling wire pattern CWP1 may include a number of separate wires connecting different pads to each other, or may refer to one of the wire connections between two pads.

According to some embodiments, the AC probe inspection pads A' may correspond to the AC pad A of the chip (e.g., a semiconductor chip—refer to CHP in FIG. 2) that is inspected by the probe card 200. According to some embodiments, the first DC pad DC1 may correspond to at least a portion of the DC pads DC of the chip (refer to CHP in FIG. 2) that are inspected by the probe card 200. According to some embodiments, the first data pad DQ1 may correspond to at least a portion of the data pads DQ of the chip (refer to CHP in FIG. 2) that are inspected by the probe card 200.

According to some embodiments, the sum of the number of first DC pads DC1 and the number of first data pads DQ1 may be equal to the number of AC probe inspection pads A'. However, the inventive concept is not limited thereto, and the sum of the number of first DC pads DC1 and the number of first data pads DQ1 may be greater than the number of AC probe inspection pads A'.

According to some embodiments, the AC probe inspection pads A' may be connected to any one of the first DC pads DC1 and the first data pads DQ1 by the first coupling wire pattern CWP1. According to some embodiments, one first DC pad DC1 or one first data pad DQ1 may be connected to one AC probe inspection pad A'. The AC probe inspection pads A' may correspond to the first DC pads DC1 and the first data pads DQ1 on a one-to-one basis, but the inventive concept is not limited thereto. For example, each of the first DC pad DC1 and the first data pad DQ1 may be connected to any one AC probe inspection pad A', a plurality of first DC pads DC1 may be connected to one AC probe inspection pad A', or a plurality of first data pads DQ1 may be connected to one AC probe inspection pad A'.

The first coupling wire pattern CWP1 may extend in the first direction X. The first coupling wire pattern CWP1 may couple the AC probe inspection pads A' with one first DC pad DC1 or one first data pad DQ1.

Figure 8:
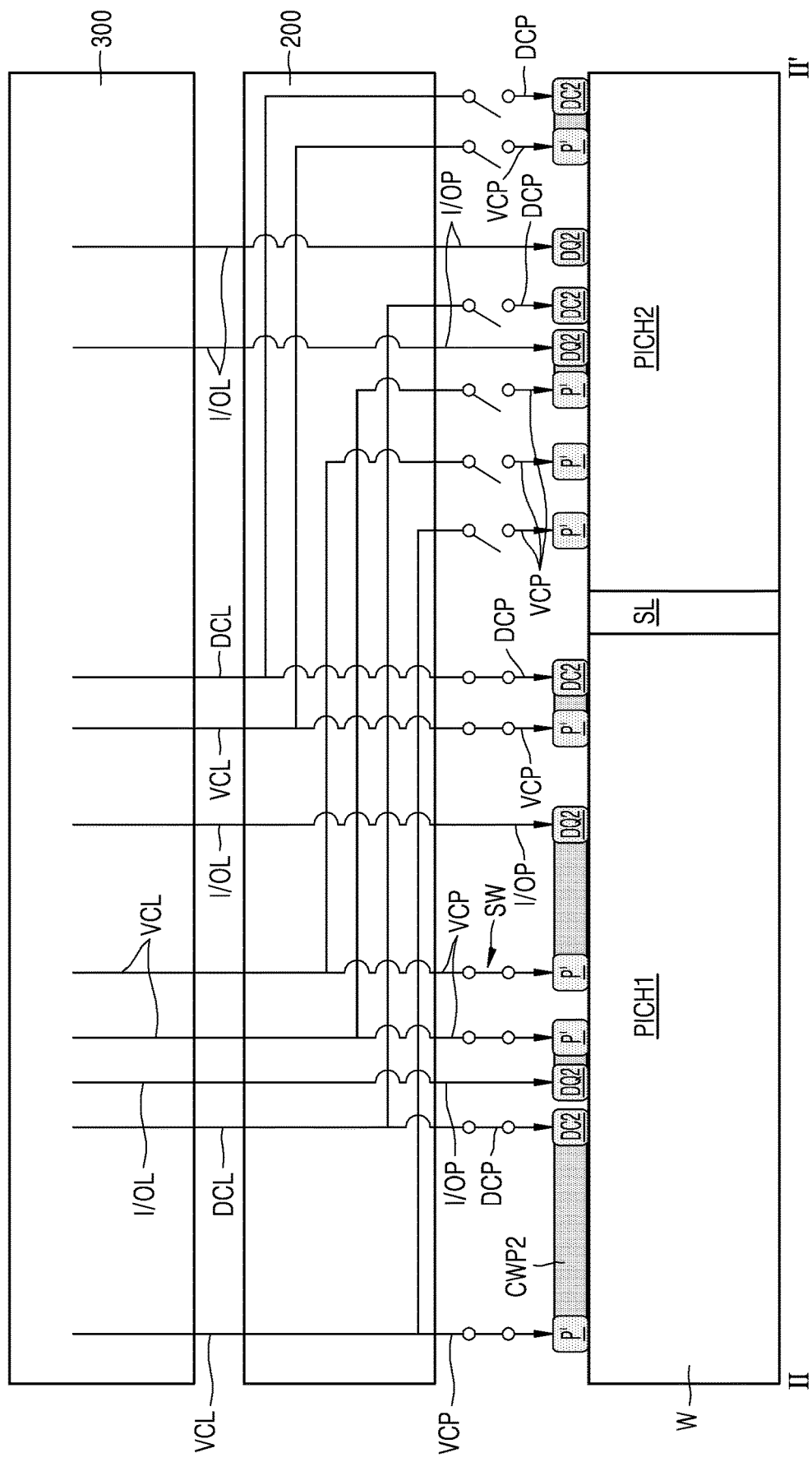

According to some embodiments, the second pad array PDAR2 may include pads and wires configured to inspect a contact of the VCC probe (refer to VCP in FIG. 8). According to some embodiments, the second pad array PDAR2 may include a VCC probe inspection pad P', a second DC pad DC2, a second data pad DQ2 (or a plurality of such pads), and a second coupling wire pattern CWP2. The second coupling wire pattern CWP2 may include a number of separate wires connecting different pads to each other, or may refer to one of the wire connections between two pads.

According to some embodiments, the VCC probe inspection pad P' may correspond to the power pad P of the chip (refer to CHP in FIG. 2) that is inspected by the probe card 200. According to some embodiments, the second DC pad DC2 may correspond to at least a portion of the DC pads DC of the chip (refer to CHP in FIG. 2) that are inspected by the probe card 200. According to some embodiments, the second data pad DQ2 may correspond to at least a portion of the data pads DQ of the chip (refer to CHP in FIG. 2) that are inspected by the probe card 200.

According to some embodiments, the sum of the number of second DC pads DC2 and the number of second data pads DQ2 may be equal to the number of VCC probe inspection pads P'. However, the inventive concept is not limited thereto, and the sum of the number of second DC pads DC2 and the number of second data pads DQ2 may be greater than the number of VCC probe inspection pads P'.

According to some embodiments, the VCC probe inspection pads P' may be connected to any one of the second DC pad DC2 and the second data pad DQ2 by the first coupling wire pattern CWP1. According to some embodiments, one second DC pad DC2 or one second data pad DQ2 may be connected to one VCC probe inspection pad P'. The VCC probe inspection pads P' may correspond to the second DC pads DC2 and the second data pads DQ2 on a one-to-one basis, but the inventive concept is not limited thereto. For example, each of the second DC pad DC2 and the second data pad DQ2 may be connected to any one AC probe inspection pad A', a plurality of second DC pads DC2 may be connected to one VCC probe inspection pad P', or a plurality of second data pads DQ2 may be connected to one VCC probe inspection pad P'.

The second coupling wire patterns CWP2 may extend in the first direction X. The second coupling wire patterns CWP2 may couple the VCC probe inspection pads P' to one second DC pad DC2 or one second data pad DQ2.

Figure 9:
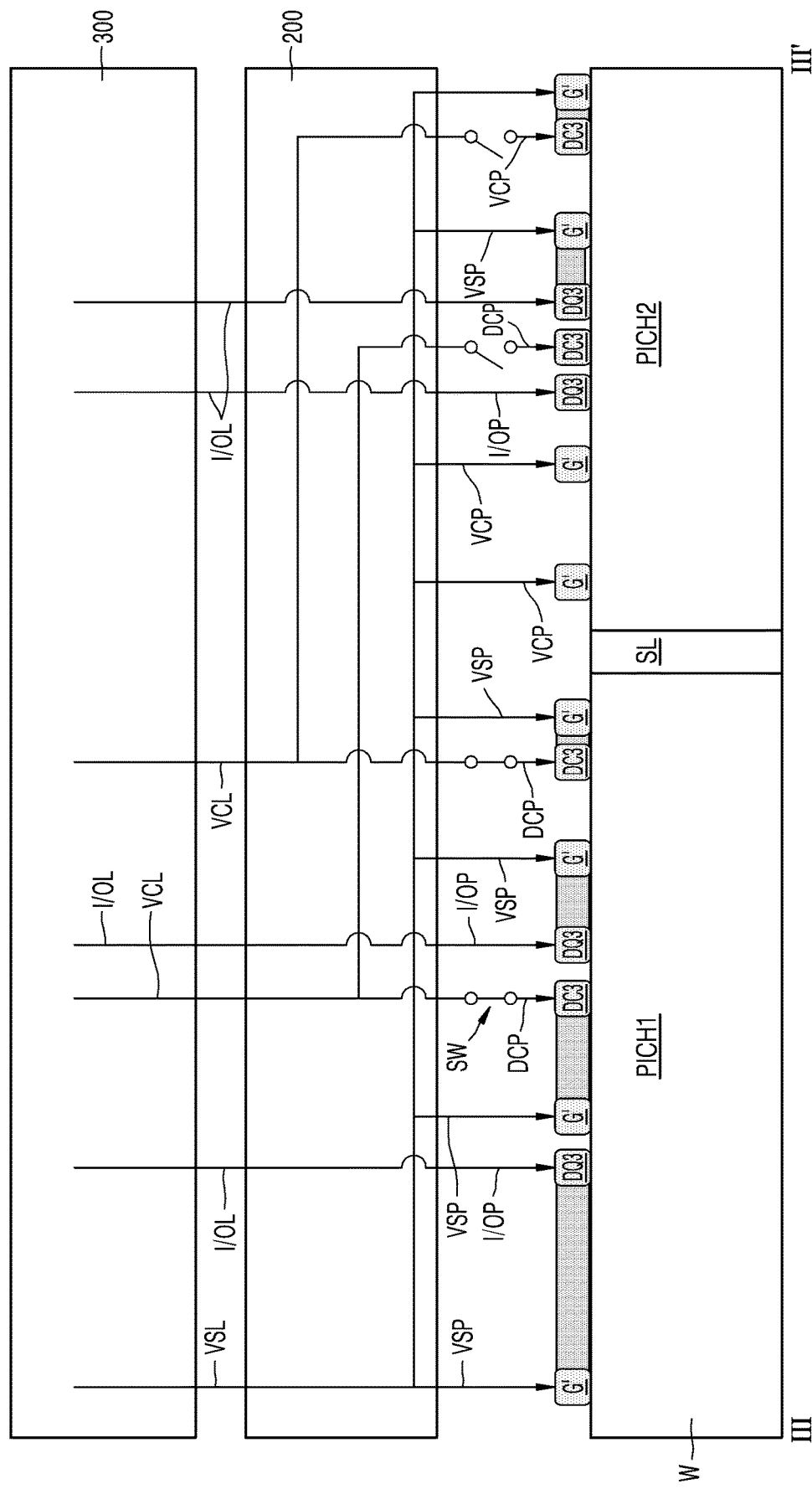

According to some embodiments, the third pad array PDAR3 may include pads and wires configured to inspect a contact of a VSS probe (refer to VSP in FIG. 9). According to some embodiments, the third pad array PDAR3 may include VSS probe inspection pads G', a third DC pad (or pads) DC3, a third data pad (or pads) DQ3, and a third coupling wire pattern CWP3. The third coupling wire pattern CWP3 may include a number of separate wires connecting different pads to each other, or may refer to one of the wire connections between two pads.

According to some embodiments, the VSS probe inspection pad G' may correspond to the ground pad G of the chip (refer to CHP in FIG. 2) that is inspected by the probe card 200. According to some embodiments, the third DC pad DC3 may correspond to at least a portion of the DC pads DC of the chip (refer to CHP in FIG. 2) that are inspected by the probe card 200. According to some embodiments, the third data pad DQ3 may correspond to at least a portion of the data pads DQ of the chip (refer to CHP in FIG. 2) that are inspected by the probe card 200.

According to some embodiments, the sum of the number of third DC pads DC3 and the number of third data pads DQ3 may be equal to the number of VSS probe inspection pads G'. However, the inventive concept is not limited thereto, and the sum of the number of third DC pads DC3 and the number of third data pads DQ3 may be greater than the number of VSS probe inspection pads G'.

According to some embodiments, the VSS probe inspection pads G' may be connected to any one of the third DC pad DC3 and the third data pad DQ3 by the third coupling wire pattern CWP3. According to some embodiments, one third DC pad DC3 or one third data pad DQ3 may be connected to one VSS probe inspection pad G'. The VSS probe inspection pads G' may correspond to the third DC pad DC3 and the third data pad DQ3 on a one-to-one basis, but the inventive concept is not limited thereto. For example, each of the third DC pad DC3 and the third data pad DQ3 may be connected to any one AC probe inspection pad A', a plurality of third DC pads DC3 may be connected to one VSS probe inspection pad G', or a plurality of third data pads DQ3 may be connected to one VSS probe inspection pad G'.

The third coupling wire patterns CWP3 may extend in the first direction X. The third coupling wire patterns CWP3 may couple the VSS probe inspection pads G' to one third DC pad DC3 or one third data pad DQ3.

FIGS. 7 to 9 are respectively cross-sectional views taken along lines I-I', II-II', and III-III' of FIG. 5.

According to some embodiments, the probe 234 shown in FIG. 1 may include an input/output (I/O) probe I/OP, a VCC probe VCP, a VSS probe VSP, a DC probe DCP, and an AC probe ACP.

Referring to FIG. 7, the I/O probe I/OP may be a probe that is brought into contact with the data pad (refer to DQ in FIG. 4) when the chip (refer to CHP in FIG. 4) is inspected using the probe card 200. According to some embodiments, one I/O probe I/OP may correspond to one I/O line I/OL. In this manner, only one I/O probe I/OP may be connected to one I/O line I/OL. The I/O probe I/OP may be dedicated to the one I/O line I/OL. Here, the I/O line I/OL may be an electrical path for allowing an electric signal of the tester head 320 to be transmitted to the probe card 200. Hereinafter, a single probe connected to the electrical path of the tester head 320 as in a relationship between the I/O line I/OL and the I/O probe I/OP will be referred to as an unmerged probe, or dedicated probe.

The AC probe ACP may be a probe that is brought into contact with the AC pad (refer to A in FIG. 4) when the chip (refer to CHP in FIG. 4) is inspected using the probe card 200. According to some embodiments, a plurality of AC probes ACP may correspond to one AC line ACL. That is, a plurality of AC probes ACP may be connected to one AC line ACL. Here, the AC line ACL may be an electrical path for allowing an electric signal of the tester head 320 to be transmitted to the probe card 200.

According to some embodiments, to simultaneously inspect a plurality of adjacent chips, one AC line ACL may be branched into the plurality of AC probes ACP and connected to AC pads (refer to A in FIG. 4) that implement the same functions in adjacent chips (refer to CHP in FIG. 4).

More specifically, when the probe card (refer to 200 in FIG. 1) is inspected by a probe card inspection wafer, one AC line ACL may be connected to an AC probe inspection pad A' included in a first probe card inspection chip PICH1 and an AC probe inspection pad A' included in a second probe card inspection chip PICH2 by a merged AC probe ACP. Although two probe card inspection chips are illustrated in FIGS. 5, 7, 8, and 9 for brevity, probes corresponding to at least three chips or at least three probe card inspection chips may be merged with each other.

Hereinafter, as in the case of the AC line ACL and the AC probe ACP, a structure in which a plurality of probes corresponding to different chips are connected to an electrical path configured to connect the tester head (refer to 320 in FIG. 1) with the probe card (refer to 200 in FIG. 1) will be referred to as a merged probe. Similarly, when a plurality of probes are connected to one signal line, the plurality of probes will be referred to as probes merged with each other. As depicted in FIG. 7, for example, these probes may be merged with wiring included within the probe card 200.

The AC probe ACP may not be connected to a switch element SW. According to some embodiments, the AC probe ACP may include a resistor R, but the inventive concept is not limited thereto.

The DC probe DCP may be a probe that is brought into contact with the DC pad (refer to DC in FIG. 4) when the chip (refer to CHP in FIG. 4) is inspected using the probe card 200. According to some embodiments, a plurality of DC probes DCP may correspond to one DC line DCL. For example, a plurality of DC probes DCP may be connected to one DC line DCL. Here, the DC line DCL may be an electrical path for allowing an electric signal of the tester head 320 to be transmitted to the probe card 200. According to some embodiments, the DC probe DCP may be a merged probe.

According to some embodiments, the DC probe DCP (e.g., each DC probe DCP) may be connected to the switch element SW (e.g., a respective switch element SW), such as a relay and a transistor. An electric signal may be transmitted to only a portion of the DC probes DCP (e.g., a set of the DC probes (DCP) that are merged by the switch element SW (e.g., by the switch element SW being in a closed state). According to some embodiments, the probe card inspection chip may be classified into a plurality of groups, and probes of the probe card 200, which correspond to the plurality of groups, may be sequentially inspected. According to some embodiments, the number of groups may be equal to the number of merged probes.

Referring to FIG. 8, the VCC probe VCP may be a probe that is brought into contact with the power pad (refer to P in FIG. 4) when the chip (refer to CHP in FIG. 4) is inspected using the probe card 200. According to some embodiments, a plurality of VCC probes VCP may correspond to one VCC line VCL. According to some embodiments, a plurality of VCC probes VCP may be connected to one VCC line VCL. A plurality of VCP groupings may be implemented. Here, the VCC line VCL may be an electrical path for allowing an electric signal of the tester head 320 to be transmitted to the probe card 200. According to some embodiments, the plurality of VCC probes VCP connected to a single VCC line VCL may be merged probes. According to some embodiments, each of the plurality of VCC probes VCP may be connected to the switch element SW, such as a relay and a transistor.

Referring to FIG. 9, the VSS probe VSP may be a probe that is brought into contact with the ground pad (refer to G in FIG. 4) when the chip (refer to CHP in FIG. 4) is inspected using the probe card 200. According to some embodiments, a plurality of VSS probes VSP may correspond to one VSS line VSL. For example, a plurality of VSS probes VSP may be connected to one VSS line VSL. Here, the VSS line VSL may be an electrical path for allowing an electric signal of the tester head 320 to be transmitted to the probe card 200. According to some embodiments, the VSS probe VSP may be a merged probe. According to some embodiments, the VSS probe VSP may not be connected to any switch elements SW. In some cases, all of the VSS probes VSP may be merged with one VSS line VSL, but the inventive concept is not limited thereto.

To summarize the descriptions with reference to FIGS. 7 to 9, each of the DC probe DCP and the VCC probe VCP may be a merged probe and connected to the switch element SW. Each of the AC probe ACP and the VSS probe VSP may be a merged probe and may not be connected to the switch element SW. The I/O probe I/OP may be an unmerged probe.

Referring back to FIGS. 6 and 7, when the probes (refer to 234 in FIG. 1) are aligned with a first pad array PDAR1, the AC probes ACP may be in contact with the AC probe inspection pads A'. According to some embodiments, when the probes (refer to 234 in FIG. 1) are aligned with the first pad array PDAR1, the DC probes DCP may be in contact with respective first DC pads DC1 (though some of the DC probes DCP may be electrically disconnected from the test head 320 via switches SW), and the I/O probes I/OP may be in contact with respective first data pads DQ1.

Thus, an AC probe inspection loop including the AC line ACL, the AC probe ACP, the AC probe inspection pad A', the first coupling wire pattern CWP1, the first data pad DQ1, the I/O probe I/OP, and the I/O line I/OL may be formed. Also, an AC probe inspection loop including the AC line ACL, the AC probe ACP, the AC probe inspection pad A', the first coupling wire pattern CWP1, the first DC pad DC1, the DC probe DCP, and the DC line DCL may be formed.

According to some embodiments, an electric signal of a voltage or current type may be applied to the AC probe inspection pad A', the first coupling wire pattern CWP1, and the first data pad DQ1 using the AC probe ACP, and the electric signal may be read using the I/O probe I/OP or the DC probe DCP.

Hereinafter, for brevity, a probe that is to be inspected by applying an electric signal will be referred to as a probe to be inspected, and a probe configured to provide an electrical path for reading a signal to the tester head 320 will be referred to as a read probe. Also, a pad that is brought into contact with the probe to be inspected will be referred to as a pad to be inspected, and a pad that is in contact with the read probe will be referred to as a read pad.

Referring to FIGS. 6 and 8, when probes (refer to 234 in FIG. 1) are aligned with a second pad array PDAR2, the VCC probes VCP may be in contact with a VCC probe inspection pads P'. According to some embodiments, when the probes (refer to 234 in FIG. 1) are aligned with the second pad array PDAR2, the DC probes DCP may be in contact with respective second DC pads DC2 (though some of the DC probes DCP may be electrically disconnected from the test head 320 via switches SW) and the I/O probes I/OP may be in contact with respective second data pads DQ2.

Thus, a VCC probe inspection loop including the VCC line VCL, the VCC probe VCP, the VCC probe inspection pad P', the second coupling wire pattern CWP2, the second data pad DQ2, the I/O probe I/OP, and the I/O line I/OL may be formed. Also, a VCC probe inspection loop including the VCC line VCL, the VCC probe VCP, the VCC probe inspection pad P', the second coupling wire pattern CWP2, the second DC pad DC2), the DC probe DCP, and the DC line DCL may be formed. In this case, the VCC probe VCP may be a probe to be inspected, and the I/O probe I/OP and the DC probe DCP may be read probes.

Referring to FIG. 9, when the probes (refer to 234 in FIG. 1) are aligned with a third pad array PDAR3, the VSS probes VSP may be in contact with VSS probe inspection pads G'. According to some embodiments, when the probes (refer to 234 in FIG. 1) are aligned with the third pad array PDAR3, the DC probes DCP may be in contact with respective third DC pads DC3 (though some of the DC probes DCP may be electrically disconnected from the test head 320 via switches SW) and the I/O probes I/OP may be in contact with respective third data pads DQ3.

Thus, a VSS probe inspection loop including the VSS line VSL, the VSS probe VSP, the VSS probe inspection pad G', the third coupling wire pattern CWP3, the third data pad DQ3, the I/O probe I/OP, and the I/O line I/OL may be formed. Also, a VSS probe inspection loop including the VSS line VCL, the VSS probe VSP, the VSS probe inspection pad G', the third coupling wire pattern CWP3, the third DC pad DC3, the DC probe DCP, and the DC line DCL may be formed. In this case, the VSS probe VSP may be a probe to be inspected, and the I/O probe I/OP and the DC probe DCP may be read probes.

To increase inspection speed of semiconductor devices, lines (e.g., power lines, signal lines, and ground lines) between a tester head and a probe card may be connected to a plurality of merged probes of the probe card. In the related art, since probes inspect contacts using unpatterned metal patterns, it may be difficult to determine which probe has an electrical defect from among merged probes. Thus, in the related art, the inspection of whether the merged probes are contacted may be performed by the naked eye, and thus, the speed and reliability of the inspection may be degraded. According to some embodiments, merged probes may be coupled with unmerged probes or merged probes connected to a switch to inspect a probe card. Thus, the inspection speed and reliability of the probe card may be increased.

Figure 10:
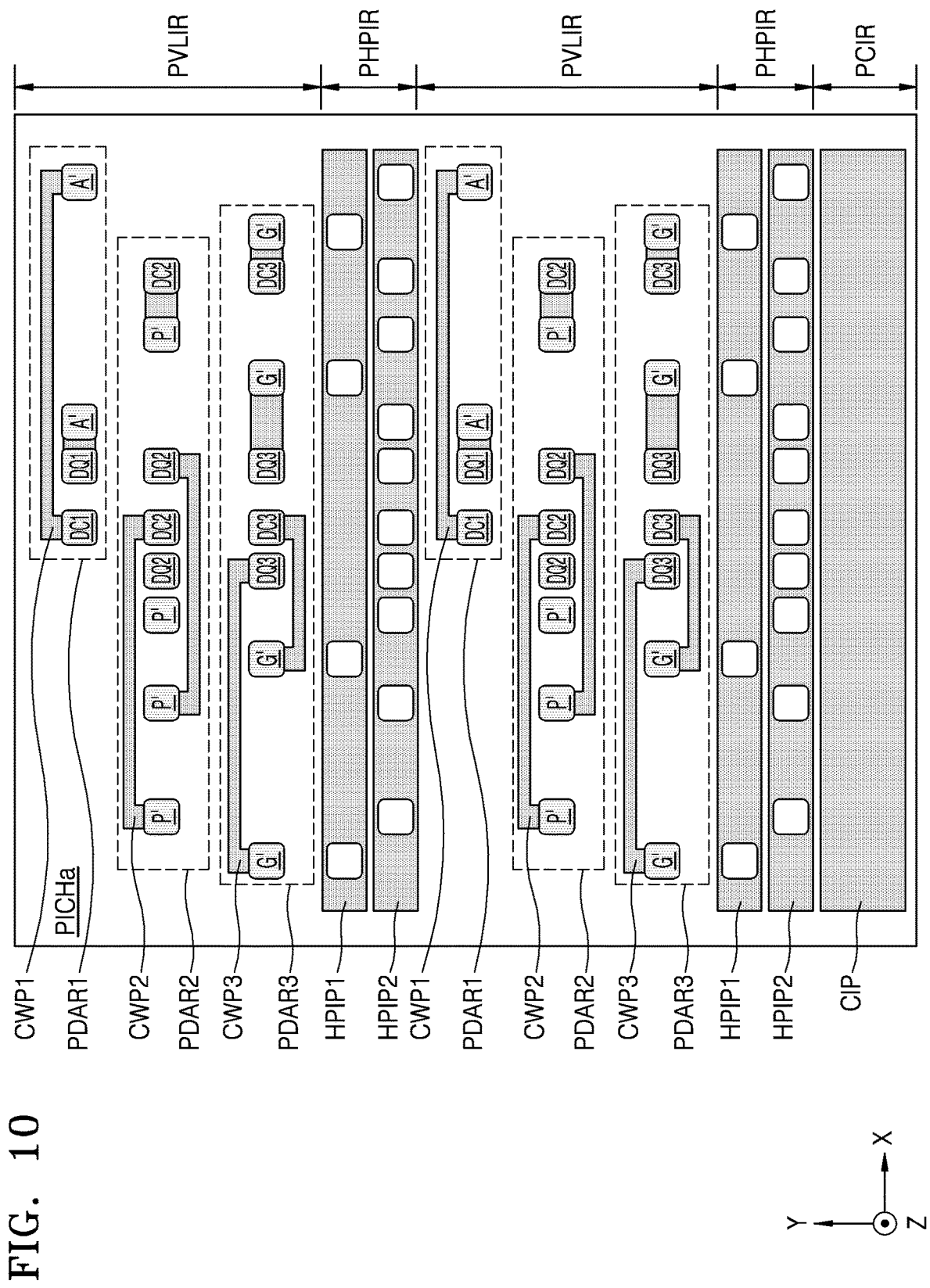
FIGS. 10 to 12 are plan views of a probe card inspection chip included in a probe card inspection wafer according to some embodiments.

FIG. 10 is a plan view of a probe card inspection chip PICHa included in a probe card inspection wafer according to some embodiments. Only one probe card inspection chip PICHa is illustrated in FIG. 10 for brevity. The same descriptions as in FIGS. 5 to 9 will be omitted, and differences will mainly be described.

Referring to FIG. 10, the probe card inspection chip PICHa may include a plurality of probe vertical-level inspection regions PVLIR, a plurality of probe horizontal-position inspection regions PHPIR, and a probe contact inspection region PCIR.

Unlike shown in FIG. 5, the plurality of probe vertical-level inspection regions PVLIR and the plurality of probe horizontal-position inspection regions PHPIR, which are relatively vulnerable to damage, may be formed in the remaining space of a chip CHP, and thus, costs for producing probe card inspection wafers may be reduced.

Figure 11:
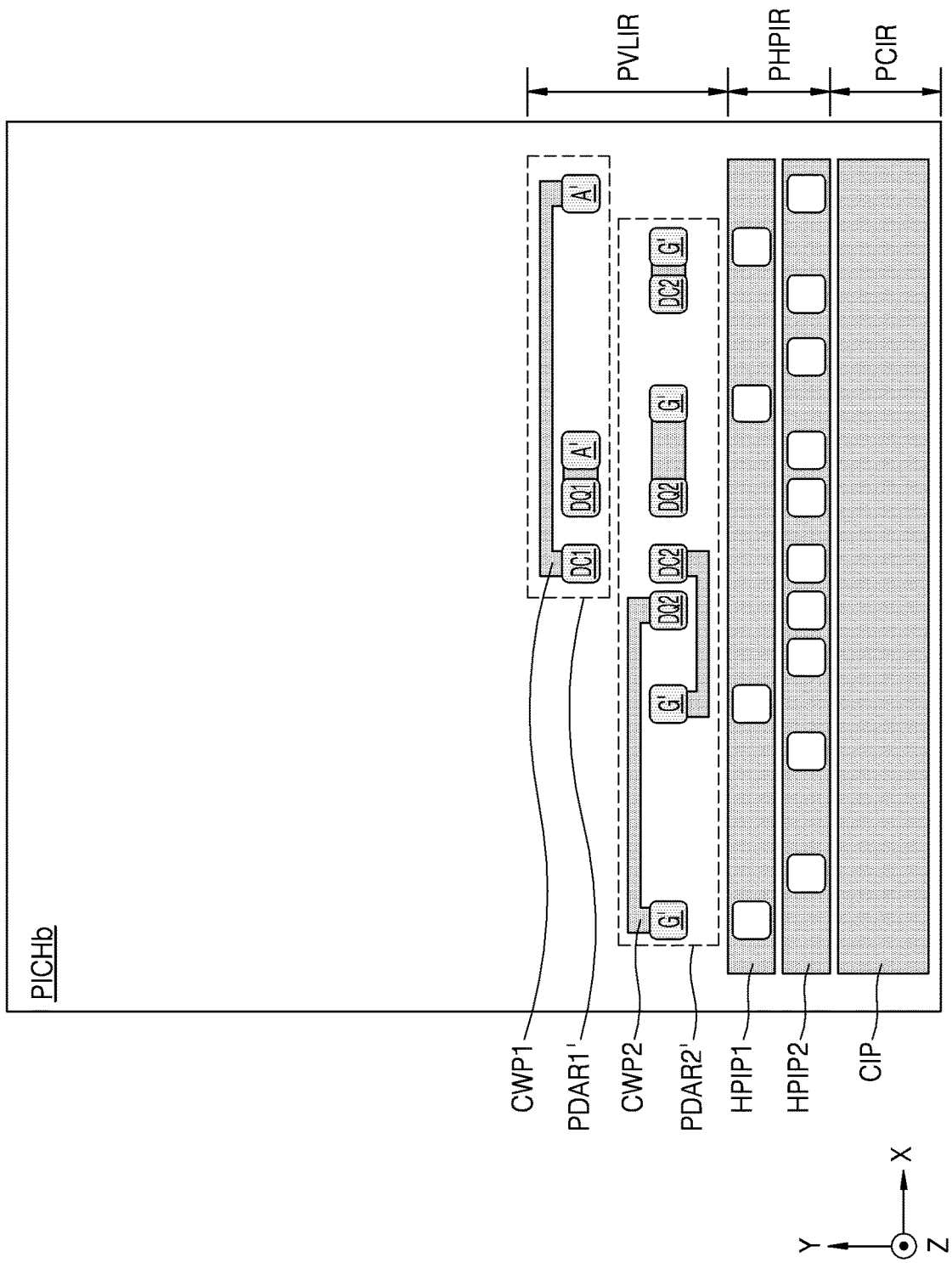

FIG. 11 is a plan view of a probe card inspection chip PICHb included in a probe card inspection wafer according to some embodiments. The same descriptions as in FIGS. 5 to 9 will be omitted for brevity, and differences will mainly be described.

Referring to FIG. 11, the probe card inspection chip PICHb may include a probe vertical-level inspection region PVLIR, a probe horizontal-position inspection region PHPIR, and a probe contact inspection region PCIR.

According to some embodiments, first and second pad arrays PDAR1' and PDAR2' may be arranged on the probe vertical-level inspection region PVLIR. The first pad array PDAR1' may include AC probe inspection pads A', a first DC pad DC1, a first data pad DQ1, and first coupling wire patterns CWP1. The second pad array PDAR2' may include VSS probe inspection pads G', a second DC pad DC2, a second data pad DQ2, and second coupling wire patterns CWP2. As described above, a VCC probe may be connected to a switch element SW and inspected by a contact inspection pattern CIP. Thus, a pad array configured to inspect the VCC probe may be omitted.

Thus, an area occupied by the probe vertical-level inspection region PVLIR in the probe card inspection chip PICHb may be reduced, and thus, the probe horizontal-position inspection region PHPIR and the probe contact inspection region PCIR may be repeatedly provided a larger number of times. Thus, manufacturing costs of probe cards may be reduced.

FIG. 12 is a plan view of a probe card inspection chip PICHc included in a probe card inspection wafer according to some embodiments. The same descriptions as in FIGS. 5 to 9 and 11 will be omitted for brevity, and differences will mainly be described.

Referring to FIG. 12, the probe card inspection chip PICHc may include a probe vertical-level inspection region PVLIR, a probe horizontal-position inspection region PHPIR, and a probe contact inspection region PCIR.

According to some embodiments, first and second pad arrays PDAR1" and PDAR2" may be arranged on the probe vertical-level inspection region PVLIR.

The first pad array PDAR1" may include AC probe inspection pads A', a first DC pad DC1, a first VSS pad P1, and first coupling wire patterns CWP1. In the first pad array PDAR1", AC probes may be probes to be inspected, and some VCC probes and some DC probes may be read probes. According to some embodiments, the AC probe inspection pads A' may be pads to be inspected, and the first DC pad DC1 and the first VSS pad P1 may be read pads.

The second pad array PDAR2" may include VSS probe inspection pads G', a second DC pad DC2, a second data pad DQ2, and second coupling wire patterns CWP2. In the second pad array PDAR2", VSS probes may be probes to be inspected, and some VCC probes, some DC probes, and some I/O probes may be read probes. According to some embodiments, the VSS probe inspection pads G' may be pads to be inspected, and the second DC pads DC2, the second data pads DQ2, and second VCC pads P2 may be read pads.

As described above, since the VCC probe is connected to a switch element SW and inspected by a contact inspection pattern CIP, a pad array configured to inspect the VCC probe may be omitted. Furthermore, a signal applied by the AC probe or the VSS probe may be read using not only the DC probe and the I/O probe but also the VCC probe.

Thus, a degree of freedom for design of pattern arrays included in the probe card inspection chip PICHc may be enhanced.

Figure 13:
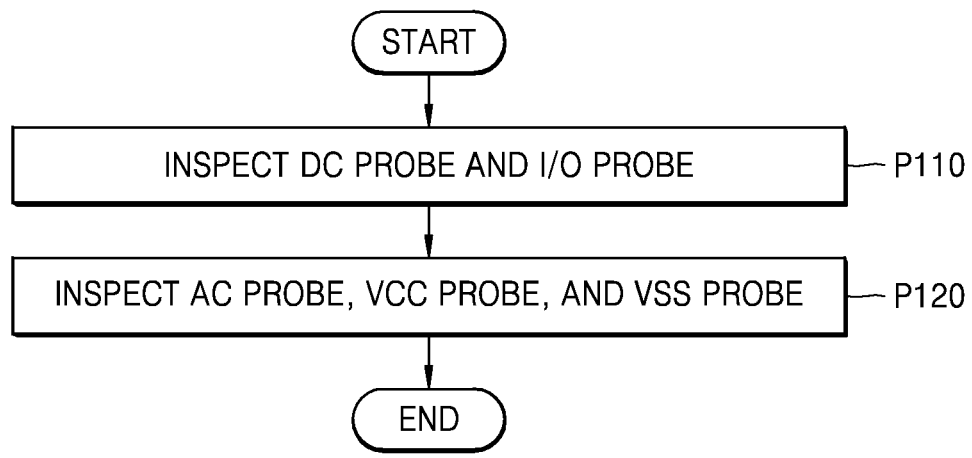
FIGS. 13 to 15 are flowcharts illustrating a method of inspecting a probe card, according to some embodiments.
Figure 14:
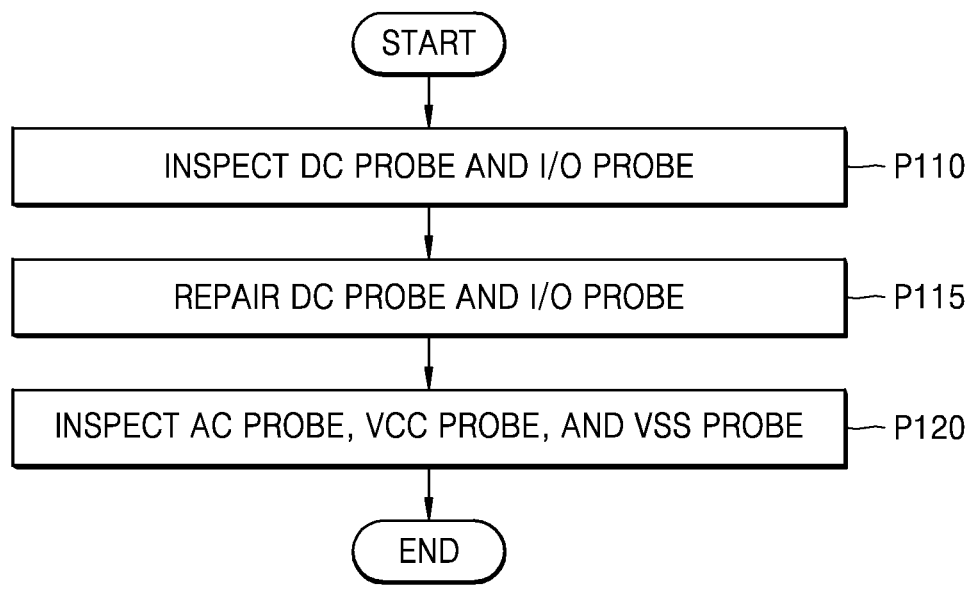
Figure 15:
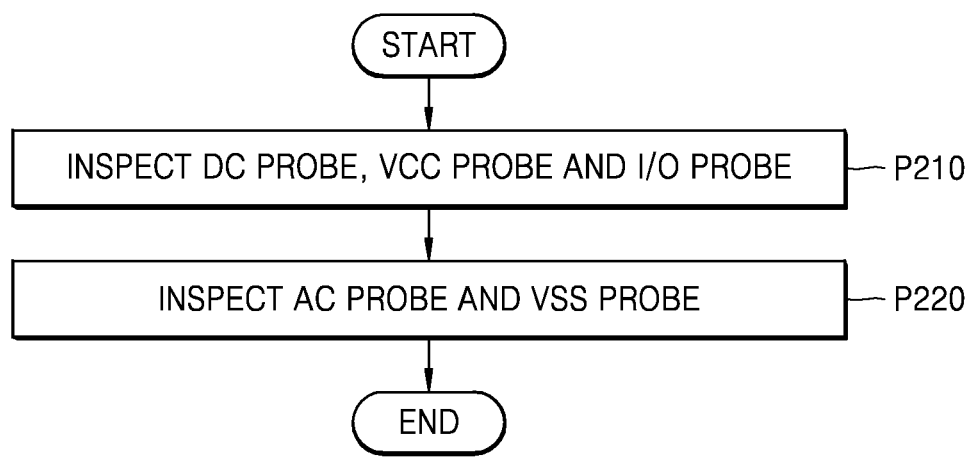

FIGS. 13 to 15 are flowcharts illustrating a method of inspecting a probe card, according to some embodiments.

Referring to FIGS. 5 to 9 and 13, in operation P110, contacts of a DC probe DCP and an I/O probe I/OP may be inspected. As described above, the inspection of the DC probe DCP and the I/O probe I/OP may be performed using a contact inspection pattern CIP.

According to some embodiments, the contact inspection pattern CIP may be a pattern configured to inspect a contact of a probe connected to a switch, from among an unmerged probe and/or a merged probe. More specifically, after probes are brought into contact with the contact inspection pattern CIP, an electric signal may be applied to the contact inspection pattern CIP by a VCC probe (refer to VCP in FIG. 8), and the electric signal may be read using the unmerged probe so that a contact of the unmerged probe can be inspected. Similarly, an electric signal may be applied to the contact inspection pattern CIP. While a switch of one probe of merged probes connected to switches is turned off, the electric signal may be read using the probe of which the switch is turned off. The application and reading of the electric signal may be sequentially repeated, so that a contact of the merged probe connected to the switch may be inspected. According to some embodiments, a contact of only the I/O probes I/OP may be inspected using the contact inspection pattern CIP. According to some embodiments, contacts of the I/O probes I/OP and the DC probes DCP may be inspected using the contact inspection pattern CIP. According to some embodiments, contacts of the I/O probes I/OP and the VCC probes VCP may be inspected using the contact inspection pattern CIP. According to some embodiments, the contacts of the I/O probes I/OP, the DC probes DCP, and the VCC probes VCP may be inspected using the contact inspection pattern CIP.

Thereafter, in operation P120, contacts of the AC probe ACP, the VCC probe VCP, and the VSS probe VSP may be inspected. According to some embodiments, the AC probe ACP, the VCC probe VCP, and the VSS probe VSP may be inspected in an arbitrary order. The inspection of the AC probe ACP, the VCC probe VCP, and the VSS probe VSP may be performed in the same manner as described with reference to FIGS. 5 to 9.

Referring to FIGS. 5 to 9, horizontal positions of probes may be further inspected by the first and second horizontal-position inspection patterns HPIP1 and HPIP2. According to some embodiments, the first horizontal-position inspection pattern HPIP1 may be a pattern configured to inspect a horizontal position of the VSS probe VSP. According to some embodiments, the second horizontal-position inspection pattern HPIP2 may be a pattern configured to inspect horizontal positions of probes except for the VSS probe VSP. According to some embodiments, the second horizontal-position inspection pattern HPIP2 may be patterns configured to inspect horizontal positions of the I/O probe I/OP, the VCC probe VCP, the VSS probe VSP, the DC probe DCP, and the AC probe ACP.

As described above, the first horizontal-position inspection pattern HPIP1 may include a shape obtained by etching a conductive material in a position corresponding to a ground pad G included in the chip CHP of FIG. 2. Accordingly, when probes are aligned to be in contact with the first horizontal-position inspection pattern HPIP1, the VSS probes VSP may not be in contact with the first horizontal-position inspection pattern HPIP1. When an electric signal is applied to the first horizontal-position inspection pattern HPIP1 through a probe (e.g., the VCC probe VCP), which is in contact with the first horizontal-position inspection pattern HPIP1, and then the electric signal is read from one of the VSS probes VSP, it may be determined that horizontal positions of the VSS probes VSP are misaligned.

As described above, the second horizontal-position inspection pattern HPIP2 may include a pattern obtained by removing a conductive material in positions corresponding to a power pad P, an AC pad A, a data pad DQ, and a DC pad DC included in the chip CHP of FIG. 2. Accordingly, when the probes are aligned to be in contact with the second horizontal-position inspection pattern HPIP2, the I/O probe I/OP, the VCC probe VCP, the VSS probe VSP, the DC probe DCP, and the AC probe ACP may not contact the first horizontal-position inspection pattern HPIP1. When an electric signal is applied to the second horizontal-position inspection pattern HPIP2 through a probe (e.g., the VSS probe VSP), which is in contact with second horizontal-position inspection pattern HPIP2, and then the electric signal is read from one of the I/O probe I/OP, the VCC probe VCP, the VSS probe VSP, the DC probe DCP, and the AC probe ACP, it may be determined that a horizontal position of the corresponding probe is misaligned.

Referring to FIG. 13, while a switch element SW connected to the DC probe DCP that is in contact with a first DC pad DC1 included in first probe card inspection chips PICH1 is turned on and a switch element SW connected to the DC probe DCP in contact with a first DC pad DC1, and included in a second probe card inspection chip PICH2, which is merged with the DC probe DCP in contact with a first DC pad DC1 included in first probe card inspection chips PICH1, is turned off, an AC probe ACP in contact with AC probe inspection pads A' included in the first probe card inspection chips PICH1 may be inspected. After the inspection using the first probe card inspection chips PICH1 is completed, while the switch element SW connected to the DC probe DCP that is in contact with the first DC pad DC1 included in the first probe card inspection chips PICH1 is turned off and the switch element SW connected to the DC probe DCP in contact with the first DC pad DC1, and included in the second probe card inspection chips PICH2, which is merged with the DC probe DCP in contact with a first DC pad DC1 included in first probe card inspection chips PICH1, is turned on, an AC probe ACP in contact with AC probe inspection pads A' included in the second probe card inspection chips PICH2 may be inspected. According to some embodiments, a plurality of chips corresponding to a plurality of probes that are merged with each other may be sequentially inspected.

Even when the VCC probes VCP and the VSS probes VSP are inspected, merged probes may be sequentially inspected in substantially the same manner as the AC probes ACP described above.

Referring to FIG. 14, unlike the method described with reference to FIG. 13, after contacts of the DC probe DCP and the I/O probe I/OP are inspected in operation S110, the DC probe DCP and the I/O probe I/OP, which are determined as defective, may be repaired. As described above, when the AC probes ACP, the VSS probes VSP, and the VCC probes VCP are inspected, the DC probes DCP and the I/O probes I/OP may be used to read electric signals. Thus, when defects occur in the DC probe DCP and the I/O probe I/OP, it may be impossible to inspect contact defects of the AC probes ACP, the VSS probes VSP, and the VCC probes VCP. Accordingly, when the DC probe DCP and the I/O probe I/OP are determined as defective based on the inspection result in operation P110, the DC probe DCP and the I/O probe I/OP may be repaired in operation P115, and operation P120 may be performed. In contrast, when the DC probe DCP and the I/O probe I/OP are determined as normal based on the inspection result in operation P110, operation P115 may be omitted.

Referring to FIG. 15, in operation P210, contacts of the DC probes DCP, the I/O probes I/OP, and the VCC probes VCP may be inspected in substantially the same manner as operation P110 of FIG. 13. Thereafter, in operation P220, contacts of the AC probes ACP and the VSS probes VSP may be inspected using the DC probes DCP, the I/O probe I/OP, and the VCC probes VCP as read probes in a similar manner to operation P110 of FIG. 13.

While the inventive concept has been particularly shown and described with reference to embodiments thereof, it will be understood that various changes in form and details may be made therein without departing from the spirit and scope of the following claims.

What is claimed is:
1. A probe card inspection system comprising:
a base wafer; and
first and second probe card inspection chips on the base wafer and spaced apart from each other, wherein each of the first and second probe card inspection chips located on the base wafer is divided into a probe vertical-level inspection region, a probe horizontal-position inspection region, and contact inspection regions, wherein the first and second probe card inspection chips each comprise:

a first pad array on the probe vertical-level inspection region, the first pad array being configured for inspecting vertical levels of first and second alternating-current AC probes of a probe card to be inspected, and the first pad array including a first row of pads, the first row extending in a first direction;

a second pad array on the probe vertical-level inspection region, the second pad array being configured for inspecting vertical levels of first and second VSS probes of the probe card to be inspected, and the second pad array including a second row of pads, the second row extending in the first direction, wherein the second row is separated from and parallel to the first row.

2. The probe card inspection system of claim 1, wherein the first and second probe card inspection chips are substantially identical to each other.

3. The probe card inspection system of claim 1, wherein each of the first and second AC probes and the first and second VSS probes does not comprise a switch element.

4. The probe card inspection system of claim 1, wherein:

each first pad array comprises AC probe inspection pads and first read pads, and first coupling wire patterns connect the AC probe inspection pads with the first read pads, and each second pad array comprises VSS probe inspection pads and second read pads, and second coupling wire patterns connect the VSS probe inspection pads with the second read pads.

5. The probe card inspection system of claim 4, wherein each wire pattern of the first and second coupling wire patterns is connected to only one read pad of the first and second read pads.

6. The probe card inspection system of claim 4, wherein each wire pattern of the first coupling wire patterns is connected to only one of the AC probe inspection pads, and each wire pattern of the second coupling wire patterns is connected to only one of the VSS probe inspection pads.

7. The probe card inspection system of claim 4, wherein the first AC probe, a first VCC probe, and the first VSS probe are configured to be inspected by using the first probe card inspection chip, the second AC probe, a second VCC probe, and the second VSS probe are configured to be inspected by using the second probe card inspection chip, and the first and second AC probes are connected to each other, and the first and second VSS probes are connected to each other.

8. The probe card inspection system of claim 4, wherein the probe card to be inspected comprises read probes, each configured to be electrically connected to a read pad of the first and second read pads.

9. The probe card inspection system of claim 8, wherein first read probes, which are some of the read probes, are not connected to other read probes.

10. The probe card inspection system of claim 9, wherein the read probes comprise second read probes connected to switch elements.

11. The probe card inspection system of claim 10, wherein at least some of the second read probes are connected to each other.

12. The probe card inspection system of claim 1, further comprising a fifth pad array on the probe vertical-level inspection region of each of the first and second probe card inspection chips, each fifth pad array being configured for inspecting vertical levels of first and second VCC probes of the probe card to be inspected.

13. The probe card inspection system of claim 12, wherein each of the first and second VCC probes is connected to a switch element.

14. The probe card inspection system of claim 12, wherein the first and second VCC probes are connected to each other.

15. A probe card inspection wafer comprising:

a base wafer;

a first region configured to connect to a probe card to test for inspection of the probe card in a vertical direction perpendicular to a top surface of the base wafer, the first region including:

a plurality of first read pads on the base wafer;

a plurality of first pads to be inspected, which are on the base wafer and apart from the plurality of first read pads in a first horizontal direction parallel to a top surface of the base wafer, the plurality of first pads to be inspected and the plurality of first read pads aligned in a first row extending in the first horizontal direction; and coupling wire patterns that each connect one of the plurality of first read pads with one of the first pads to be inspected, wherein each of the coupling wire patterns is connected to only one of the plurality of first pads to be inspected; and a second region configured to connect to a probe card to test for horizontal position inspection of the probe card, the second region including:

a horizontal-position inspection pattern including a plurality of openings, the plurality of openings arranged in the first horizontal direction, wherein the plurality of openings are aligned in a second row extending in the first horizontal direction, the second row being parallel to the first row, and a set of the plurality of openings overlap with a set of the plurality of first pads to be inspected and the plurality of first read pads in a second horizontal direction perpendicular to the first horizontal direction.

16. The probe card inspection wafer of claim 15, wherein each of the coupling wire patterns is connected to only one of the plurality of first read pads.

17. The probe card inspection wafer of claim 15, wherein the coupling wire patterns extend in the first horizontal direction, and the first read pads and the first pads to be inspected, which are connected to each other by the coupling wire patterns.

18. A probe card inspection system comprising:

a tester head configured to apply an electric signal or an electric potential to a probe card, the tester head comprising a plurality of VSS lines, a plurality of alternating-current (AC) lines, a plurality of input/output (I/O) lines, and a plurality of direct-current (DC) lines;

a probe card inspection wafer; and a chuck configured to support the probe card inspection wafer, wherein the probe card inspection wafer comprises:

a base wafer; and first and second probe card inspection chips on the base wafer, the first and second probe card inspection chips being spaced apart from each other, wherein each of the first and second probe card inspection chips located on the base wafer is divided into a probe vertical-level inspection region, a probe horizontal-position inspection region, and contact inspection regions, wherein each of the first and second probe card inspection chips comprise a first pad array and a second pad array on the probe vertical-level inspection region, wherein the first pad array comprises:

first read pads and a plurality of AC probe inspection pads spaced apart from each other and aligned with each other in a first row extending in a first direction parallel to a top surface of the base wafer; and first coupling wire patterns that each connect one of the first read pads with one of the plurality of AC probe inspection pads, wherein the second pad array comprises:

second read pads and a plurality of VSS probe inspection pads spaced apart from each other and aligned with each other in a second row extending in the first direction, the second row separated from and parallel to the first row; and second coupling wire patterns that each connect one of the second read pads with one of the plurality of AC probe inspection pads.

19. The probe card inspection system of claim 18, wherein the plurality of VSS lines are configured to be electrically connected to the VSS probe inspection pads through the probe card, and the plurality of AC lines are configured to be electrically connected to the AC probe inspection pads through the probe card, the plurality of I/O lines are configured to be electrically connected to the first or second read pads through the probe card, and the plurality of DC lines are configured to be electrically connected to the VSS probe inspection pads through the probe card.

20. The probe card inspection system of claim 19, wherein each of the plurality of VSS lines is configured to be electrically connected to one of the VSS probe inspection pads included in the first probe card inspection chip and one of the VSS probe inspection pads included in the second probe card inspection chip, and each of the plurality of AC lines is configured to be electrically connected to one of the AC probe inspection pads included in the first probe card inspection chip and one of the AC probe inspection pads included in the second probe card inspection chip.

* * * * *